US008416636B2

(12) United States Patent
Carman et al.

(10) Patent No.: US 8,416,636 B2
(45) Date of Patent: Apr. 9, 2013

(54) TECHNIQUES FOR CONTROLLING A SEMICONDUCTOR MEMORY DEVICE

(75) Inventors: Eric S. Carman, Cernex (FR); Philippe Bruno Bauser, Divonne-les-Bains (FR); Jean-Michel Daga, Peynier (FR)

(73) Assignee: Micron Technology, Inc., Boise, ID (US)

( * ) Notice: Subject to any disclaimer, the term of this patent is extended or adjusted under 35 U.S.C. 154(b) by 194 days.

(21) Appl. No.: 12/980,766

(22) Filed: Dec. 29, 2010

(65) Prior Publication Data
US 2011/0199848 A1 Aug. 18, 2011

Related U.S. Application Data

(60) Provisional application No. 61/304,067, filed on Feb. 12, 2010.

(51) Int. Cl.
*G11C 7/00* (2006.01)
(52) U.S. Cl.
USPC ...... 365/205; 365/185.21; 365/196; 365/207; 365/189.09
(58) Field of Classification Search ............ None
See application file for complete search history.

(56) References Cited

U.S. PATENT DOCUMENTS

| | | | |
|---|---|---|---|
| 3,439,214 A | 4/1969 | Kabell | |
| 3,997,799 A | 12/1976 | Baker | |
| 4,032,947 A | 6/1977 | Kesel et al. | |
| 4,250,569 A | 2/1981 | Sasaki et al. | |
| 4,262,340 A | 4/1981 | Sasaki et al. | |
| 4,298,962 A | 11/1981 | Hamano et al. | |
| 4,371,955 A | 2/1983 | Sasaki | |

(Continued)

FOREIGN PATENT DOCUMENTS

| | | |
|---|---|---|
| CA | 272437 | 7/1927 |
| EP | 0 030 856 | 6/1981 |

(Continued)

OTHER PUBLICATIONS

Arimoto et al., A Configurable Enhanced T2RAM Macro for System-Level Power Management Unified Memory, 2006, VLSI Symposium.

(Continued)

*Primary Examiner* — Thong Q Le
(74) *Attorney, Agent, or Firm* — Wilmer Cutler Pickering Hale and Dorr LLP

(57) ABSTRACT

Techniques for controlling a semiconductor memory device are disclosed. In one particular exemplary embodiment, the techniques may be realized as a method for controlling a semiconductor memory device including applying a plurality of voltage potentials to a plurality of memory cells arranged in an array of rows and columns. Applying the plurality of voltage potentials to the plurality of memory cells may include applying a first voltage potential to a first memory cell in a row of the array via a first respective bit line and a first switch transistor, applying a second voltage potential to a second memory cell in the row of the array via a second respective bit line and a second switch transistor, and applying a third voltage potential to at least one third memory cell in the row of the array via at least one third respective bit line and at least one third switch transistor, wherein the at least one third memory cell may be located between the first memory cell and the second memory cell in the row of the array.

23 Claims, 9 Drawing Sheets

U.S. PATENT DOCUMENTS

| | | | |
|---|---|---|---|
| 4,527,181 A | 7/1985 | Sasaki | |
| 4,630,089 A | 12/1986 | Sasaki et al. | |
| 4,658,377 A | 4/1987 | McElroy | |
| 4,791,610 A | 12/1988 | Takemae | |
| 4,807,195 A | 2/1989 | Busch et al. | |
| 4,954,989 A | 9/1990 | Auberton-Herve et al. | |
| 4,979,014 A | 12/1990 | Hieda et al. | |
| 5,010,524 A | 4/1991 | Fifield et al. | |
| 5,144,390 A | 9/1992 | Matloubian | |
| 5,164,805 A | 11/1992 | Lee | |
| 5,258,635 A | 11/1993 | Nitayama et al. | |
| 5,313,432 A | 5/1994 | Lin et al. | |
| 5,315,541 A | 5/1994 | Harari et al. | |
| 5,350,938 A | 9/1994 | Matsukawa | |
| 5,355,330 A | 10/1994 | Hisamoto et al. | |
| 5,388,068 A | 2/1995 | Ghoshal et al. | |
| 5,397,726 A | 3/1995 | Bergemont et al. | |
| 5,432,730 A | 7/1995 | Shubat et al. | |
| 5,446,299 A | 8/1995 | Acovic et al. | |
| 5,448,513 A | 9/1995 | Hu et al. | |
| 5,466,625 A | 11/1995 | Hsieh et al. | |
| 5,489,792 A | 2/1996 | Hu et al. | |
| 5,506,436 A | 4/1996 | Hayashi et al. | |
| 5,515,383 A | 5/1996 | Katoozi | |
| 5,526,307 A | 6/1996 | Yiu et al. | |
| 5,528,062 A | 6/1996 | Hsieh et al. | |
| 5,568,356 A | 10/1996 | Schwartz | |
| 5,583,808 A | 12/1996 | Brahmbhatt | |
| 5,593,912 A | 1/1997 | Rajeevakumar | |
| 5,606,188 A | 2/1997 | Bronner et al. | |
| 5,608,250 A | 3/1997 | Kalnitsky | |
| 5,627,092 A | 5/1997 | Alsmeier et al. | |
| 5,631,186 A | 5/1997 | Park et al. | |
| 5,677,867 A | 10/1997 | Hazani | |
| 5,696,718 A | 12/1997 | Hartmann | |
| 5,740,099 A | 4/1998 | Tanigawa | |
| 5,754,469 A | 5/1998 | Hung et al. | |
| 5,774,411 A | 6/1998 | Hsieh et al. | |
| 5,778,243 A | 7/1998 | Aipperspach et al. | |
| 5,780,906 A | 7/1998 | Wu et al. | |
| 5,784,311 A | 7/1998 | Assaderaghi et al. | |
| 5,798,968 A | 8/1998 | Lee et al. | |
| 5,811,283 A | 9/1998 | Sun | |
| 5,847,411 A | 12/1998 | Morii | |
| 5,877,978 A | 3/1999 | Morishita et al. | |
| 5,886,376 A | 3/1999 | Acovic et al. | |
| 5,886,385 A | 3/1999 | Arisumi et al. | |
| 5,897,351 A | 4/1999 | Forbes | |
| 5,929,479 A | 7/1999 | Oyama | |
| 5,930,648 A | 7/1999 | Yang | |
| 5,936,265 A | 8/1999 | Koga | |
| 5,939,745 A | 8/1999 | Park et al. | |
| 5,943,258 A | 8/1999 | Houston et al. | |
| 5,943,581 A | 8/1999 | Lu et al. | |
| 5,960,265 A | 9/1999 | Acovic et al. | |
| 5,968,840 A | 10/1999 | Park et al. | |
| 5,977,578 A | 11/1999 | Tang | |
| 5,982,003 A | 11/1999 | Hu et al. | |
| 5,986,914 A | 11/1999 | McClure | |
| 6,018,172 A | 1/2000 | Hidaka et al. | |
| 6,048,756 A | 4/2000 | Lee et al. | |
| 6,081,443 A | 6/2000 | Morishita et al. | |
| 6,096,598 A | 8/2000 | Furukawa et al. | |
| 6,097,056 A | 8/2000 | Hsu et al. | |
| 6,097,624 A | 8/2000 | Chung et al. | |
| 6,111,778 A | 8/2000 | MacDonald et al. | |
| 6,121,077 A | 9/2000 | Hu et al. | |
| 6,133,597 A | 10/2000 | Li et al. | |
| 6,157,216 A | 12/2000 | Lattimore et al. | |
| 6,171,923 B1 | 1/2001 | Chi et al. | |
| 6,177,300 B1 | 1/2001 | Houston et al. | |
| 6,177,698 B1 | 1/2001 | Gruening et al. | |
| 6,177,708 B1 | 1/2001 | Kuang et al. | |
| 6,214,694 B1 | 4/2001 | Leobandung et al. | |
| 6,222,217 B1 | 4/2001 | Kunikiyo | |
| 6,225,158 B1 | 5/2001 | Furukawa et al. | |
| 6,245,613 B1 | 6/2001 | Hsu et al. | |
| 6,252,281 B1 | 6/2001 | Yamamoto et al. | |
| 6,262,935 B1 | 7/2001 | Parris et al. | |
| 6,292,424 B1 | 9/2001 | Ohsawa | |
| 6,297,090 B1 | 10/2001 | Kim | |
| 6,300,649 B1 | 10/2001 | Hu et al. | |
| 6,320,227 B1 | 11/2001 | Lee et al. | |
| 6,333,532 B1 | 12/2001 | Davari et al. | |
| 6,333,866 B1 | 12/2001 | Ogata | |
| 6,350,653 B1 | 2/2002 | Adkisson et al. | |
| 6,351,426 B1 | 2/2002 | Ohsawa | |
| 6,359,802 B1 | 3/2002 | Lu et al. | |
| 6,384,445 B1 | 5/2002 | Hidaka et al. | |
| 6,391,658 B1 | 5/2002 | Gates et al. | |
| 6,403,435 B1 | 6/2002 | Kang et al. | |
| 6,421,269 B1 | 7/2002 | Somasekhar et al. | |
| 6,424,011 B1 | 7/2002 | Assaderaghi et al. | |
| 6,424,016 B1 | 7/2002 | Houston | |
| 6,429,477 B1 | 8/2002 | Mandelman et al. | |
| 6,432,769 B1 | 8/2002 | Fukuda et al. | |
| 6,440,872 B1 | 8/2002 | Mandelman et al. | |
| 6,441,435 B1 | 8/2002 | Chan | |
| 6,441,436 B1 | 8/2002 | Wu et al. | |
| 6,466,511 B2 | 10/2002 | Fujita et al. | |
| 6,479,862 B1 | 11/2002 | King et al. | |
| 6,480,407 B1 | 11/2002 | Keeth | |
| 6,492,211 B1 | 12/2002 | Divakaruni et al. | |
| 6,518,105 B1 | 2/2003 | Yang et al. | |
| 6,531,754 B1 | 3/2003 | Nagano et al. | |
| 6,537,871 B2 | 3/2003 | Forbes | |
| 6,538,916 B2 | 3/2003 | Ohsawa | |
| 6,544,837 B1 | 4/2003 | Divakaruni et al. | |
| 6,548,848 B2 | 4/2003 | Horiguchi et al. | |
| 6,549,450 B1 | 4/2003 | Hsu et al. | |
| 6,552,398 B2 | 4/2003 | Hsu et al. | |
| 6,552,932 B2 | 4/2003 | Cernea | |
| 6,556,477 B2 | 4/2003 | Hsu et al. | |
| 6,560,142 B1 | 5/2003 | Ando | |
| 6,563,733 B2 | 5/2003 | Chang et al. | |
| 6,566,177 B1 | 5/2003 | Radens et al. | |
| 6,567,330 B2 | 5/2003 | Fujita et al. | |
| 6,573,566 B2 | 6/2003 | Ker et al. | |
| 6,574,135 B1 | 6/2003 | Komatsuzaki | |
| 6,590,258 B2 | 7/2003 | Divakauni et al. | |
| 6,590,259 B2 | 7/2003 | Adkisson et al. | |
| 6,617,651 B2 | 9/2003 | Ohsawa | |
| 6,621,725 B2 | 9/2003 | Ohsawa | |
| 6,632,723 B2 | 10/2003 | Watanabe et al. | |
| 6,650,565 B1 | 11/2003 | Ohsawa | |
| 6,653,175 B1 | 11/2003 | Nemati et al. | |
| 6,686,624 B2 | 2/2004 | Hsu | |
| 6,703,673 B2 | 3/2004 | Houston | |
| 6,707,118 B2 | 3/2004 | Muljono et al. | |
| 6,714,436 B1 | 3/2004 | Burnett et al. | |
| 6,721,222 B2 | 4/2004 | Somasekhar et al. | |
| 6,825,524 B1 | 11/2004 | Ikehashi et al. | |
| 6,861,689 B2 | 3/2005 | Burnett | |
| 6,870,225 B2 | 3/2005 | Bryant et al. | |
| 6,882,566 B2 | 4/2005 | Nejad et al. | |
| 6,888,770 B2 | 5/2005 | Ikehashi | |
| 6,894,913 B2 | 5/2005 | Yamauchi | |
| 6,897,098 B2 | 5/2005 | Hareland et al. | |
| 6,903,984 B1 | 6/2005 | Tang et al. | |
| 6,909,151 B2 | 6/2005 | Hareland et al. | |
| 6,912,150 B2 | 6/2005 | Portman et al. | |
| 6,913,964 B2 | 7/2005 | Hsu | |
| 6,936,508 B2 | 8/2005 | Visokay et al. | |
| 6,969,662 B2 | 11/2005 | Fazan et al. | |
| 6,975,536 B2 | 12/2005 | Maayan et al. | |
| 6,982,902 B2 | 1/2006 | Gogl et al. | |
| 6,987,041 B2 | 1/2006 | Ohkawa | |
| 7,030,436 B2 | 4/2006 | Forbes | |
| 7,037,790 B2 | 5/2006 | Chang et al. | |
| 7,041,538 B2 | 5/2006 | Ieong et al. | |
| 7,042,765 B2 | 5/2006 | Sibigtroth et al. | |
| 7,061,806 B2 | 6/2006 | Tang et al. | |
| 7,085,153 B2 | 8/2006 | Ferrant et al. | |
| 7,085,156 B2 | 8/2006 | Ferrant et al. | |
| 7,170,807 B2 | 1/2007 | Fazan et al. | |
| 7,177,175 B2 | 2/2007 | Fazan et al. | |
| 7,187,581 B2 | 3/2007 | Ferrant et al. | |

| | | |
|---|---|---|
| 7,230,846 B2 | 6/2007 | Keshavarzi |
| 7,233,024 B2 | 6/2007 | Scheuerlein et al. |
| 7,256,459 B2 | 8/2007 | Shino |
| 7,301,803 B2 | 11/2007 | Okhonin et al. |
| 7,301,838 B2 | 11/2007 | Waller |
| 7,317,641 B2 | 1/2008 | Scheuerlein |
| 7,324,387 B1 | 1/2008 | Bergemont et al. |
| 7,335,934 B2 | 2/2008 | Fazan |
| 7,341,904 B2 | 3/2008 | Willer |
| 7,416,943 B2 | 8/2008 | Figura et al. |
| 7,456,439 B1 | 11/2008 | Horch |
| 7,477,540 B2 | 1/2009 | Okhonin et al. |
| 7,492,632 B2 | 2/2009 | Carman |
| 7,517,744 B2 | 4/2009 | Mathew et al. |
| 7,539,041 B2 | 5/2009 | Kim et al. |
| 7,542,340 B2 | 6/2009 | Fisch et al. |
| 7,542,345 B2 | 6/2009 | Okhonin et al. |
| 7,545,694 B2 | 6/2009 | Srinivasa Raghavan et al. |
| 7,606,066 B2 | 10/2009 | Okhonin et al. |
| 7,696,032 B2 | 4/2010 | Kim et al. |
| 2001/0055859 A1 | 12/2001 | Yamada et al. |
| 2002/0030214 A1 | 3/2002 | Horiguchi |
| 2002/0034855 A1 | 3/2002 | Horiguchi et al. |
| 2002/0036322 A1 | 3/2002 | Divakauni et al. |
| 2002/0051378 A1 | 5/2002 | Ohsawa |
| 2002/0064913 A1 | 5/2002 | Adkisson et al. |
| 2002/0070411 A1 | 6/2002 | Vermandel et al. |
| 2002/0072155 A1 | 6/2002 | Liu et al. |
| 2002/0076880 A1 | 6/2002 | Yamada et al. |
| 2002/0086463 A1 | 7/2002 | Houston et al. |
| 2002/0089038 A1 | 7/2002 | Ning |
| 2002/0098643 A1 | 7/2002 | Kawanaka et al. |
| 2002/0110018 A1 | 8/2002 | Ohsawa |
| 2002/0114191 A1 | 8/2002 | Iwata et al. |
| 2002/0130341 A1 | 9/2002 | Horiguchi et al. |
| 2002/0160581 A1 | 10/2002 | Watanabe et al. |
| 2002/0180069 A1 | 12/2002 | Houston |
| 2003/0003608 A1 | 1/2003 | Arikado et al. |
| 2003/0015757 A1 | 1/2003 | Ohsawa |
| 2003/0035324 A1 | 2/2003 | Fujita et al. |
| 2003/0042516 A1 | 3/2003 | Forbes et al. |
| 2003/0047784 A1 | 3/2003 | Matsumoto et al. |
| 2003/0057487 A1 | 3/2003 | Yamada et al. |
| 2003/0057490 A1 | 3/2003 | Nagano et al. |
| 2003/0102497 A1 | 6/2003 | Fried et al. |
| 2003/0112659 A1 | 6/2003 | Ohsawa |
| 2003/0123279 A1 | 7/2003 | Aipperspach et al. |
| 2003/0146474 A1 | 8/2003 | Ker et al. |
| 2003/0146488 A1 | 8/2003 | Nagano et al. |
| 2003/0151112 A1 | 8/2003 | Yamada et al. |
| 2003/0231521 A1 | 12/2003 | Ohsawa |
| 2004/0021137 A1 | 2/2004 | Fazan et al. |
| 2004/0021179 A1 | 2/2004 | Lee |
| 2004/0029335 A1 | 2/2004 | Lee et al. |
| 2004/0075143 A1 | 4/2004 | Bae et al. |
| 2004/0108532 A1 | 6/2004 | Forbes et al. |
| 2004/0188714 A1 | 9/2004 | Scheuerlein et al. |
| 2004/0217420 A1 | 11/2004 | Yeo et al. |
| 2005/0001257 A1 | 1/2005 | Schloesser et al. |
| 2005/0001269 A1 | 1/2005 | Hayashi et al. |
| 2005/0017240 A1 | 1/2005 | Fazan |
| 2005/0047240 A1 | 3/2005 | Ikehashi et al. |
| 2005/0062088 A1 | 3/2005 | Houston |
| 2005/0063224 A1 | 3/2005 | Fazan et al. |
| 2005/0064659 A1 | 3/2005 | Willer |
| 2005/0105342 A1 | 5/2005 | Tang et al. |
| 2005/0111255 A1 | 5/2005 | Tang et al. |
| 2005/0121710 A1 | 6/2005 | Shino |
| 2005/0135169 A1 | 6/2005 | Somasekhar et al. |
| 2005/0141262 A1 | 6/2005 | Yamada et al. |
| 2005/0141290 A1 | 6/2005 | Tang et al. |
| 2005/0145886 A1 | 7/2005 | Keshavarzi et al. |
| 2005/0145935 A1 | 7/2005 | Keshavarzi et al. |
| 2005/0167751 A1 | 8/2005 | Nakajima et al. |
| 2005/0189576 A1 | 9/2005 | Ohsawa |
| 2005/0208716 A1 | 9/2005 | Takaura et al. |
| 2005/0226070 A1 | 10/2005 | Ohsawa |
| 2005/0232043 A1 | 10/2005 | Ohsawa |
| 2005/0242396 A1 | 11/2005 | Park et al. |
| 2005/0265107 A1 | 12/2005 | Tanaka |
| 2006/0043484 A1 | 3/2006 | Cabral et al. |
| 2006/0084247 A1 | 4/2006 | Liu |
| 2006/0091462 A1 | 5/2006 | Okhonin et al. |
| 2006/0098481 A1 | 5/2006 | Okhonin et al. |
| 2006/0126374 A1 | 6/2006 | Waller et al. |
| 2006/0131650 A1 | 6/2006 | Okhonin et al. |
| 2006/0223302 A1 | 10/2006 | Chang et al. |
| 2007/0008811 A1 | 1/2007 | Keeth et al. |
| 2007/0023833 A1 | 2/2007 | Okhonin et al. |
| 2007/0045709 A1 | 3/2007 | Yang |
| 2007/0058427 A1 | 3/2007 | Okhonin et al. |
| 2007/0064489 A1 | 3/2007 | Bauser |
| 2007/0085140 A1 | 4/2007 | Bassin |
| 2007/0097751 A1 | 5/2007 | Popoff et al. |
| 2007/0114599 A1 | 5/2007 | Hshieh |
| 2007/0133330 A1 | 6/2007 | Ohsawa |
| 2007/0138524 A1 | 6/2007 | Kim et al. |
| 2007/0138530 A1 | 6/2007 | Okhonin et al. |
| 2007/0187751 A1 | 8/2007 | Hu et al. |
| 2007/0187775 A1 | 8/2007 | Okhonin et al. |
| 2007/0200176 A1 | 8/2007 | Kammler et al. |
| 2007/0252205 A1 | 11/2007 | Hoentschel et al. |
| 2007/0263466 A1 | 11/2007 | Morishita et al. |
| 2007/0278578 A1 | 12/2007 | Yoshida |
| 2008/0049486 A1 | 2/2008 | Gruening-von Schwerin |
| 2008/0083949 A1 | 4/2008 | Zhu et al. |
| 2008/0099808 A1 | 5/2008 | Burnett et al. |
| 2008/0130379 A1 | 6/2008 | Ohsawa |
| 2008/0133849 A1 | 6/2008 | Demi et al. |
| 2008/0165577 A1 | 7/2008 | Fazan et al. |
| 2008/0253179 A1 | 10/2008 | Slesazeck |
| 2008/0258206 A1 | 10/2008 | Hofmann |
| 2009/0086535 A1 | 4/2009 | Ferrant et al. |
| 2009/0121269 A1 | 5/2009 | Caillat et al. |
| 2009/0127592 A1 | 5/2009 | El-Kareh et al. |
| 2009/0201723 A1 | 8/2009 | Okhonin et al. |
| 2010/0085813 A1 | 4/2010 | Shino |
| 2010/0091586 A1 | 4/2010 | Carman |
| 2010/0110816 A1 | 5/2010 | Nautiyal et al. |
| 2011/0080787 A1* | 4/2011 | Ruby .................. 365/185.18 |

FOREIGN PATENT DOCUMENTS

| | | |
|---|---|---|
| EP | 0 350 057 | 1/1990 |
| EP | 0 354 348 | 2/1990 |
| EP | 0 202 515 | 3/1991 |
| EP | 0 207 619 | 8/1991 |
| EP | 0 175 378 | 11/1991 |
| EP | 0 253 631 | 4/1992 |
| EP | 0 513 923 | 11/1992 |
| EP | 0 300 157 | 5/1993 |
| EP | 0 564 204 | 10/1993 |
| EP | 0 579 566 | 1/1994 |
| EP | 0 362 961 | 2/1994 |
| EP | 0 599 506 | 6/1994 |
| EP | 0 359 551 | 12/1994 |
| EP | 0 366 882 | 5/1995 |
| EP | 0 465 961 | 8/1995 |
| EP | 0 694 977 | 1/1996 |
| EP | 0 333 426 | 7/1996 |
| EP | 0 727 820 | 8/1996 |
| EP | 0 739 097 | 10/1996 |
| EP | 0 245 515 | 4/1997 |
| EP | 0 788 165 | 8/1997 |
| EP | 0 801 427 | 10/1997 |
| EP | 0 510 607 | 2/1998 |
| EP | 0 537 677 | 8/1998 |
| EP | 0 858 109 | 8/1998 |
| EP | 0 860 878 | 8/1998 |
| EP | 0 869 511 | 10/1998 |
| EP | 0 878 804 | 11/1998 |
| EP | 0 920 059 | 6/1999 |
| EP | 0 924 766 | 6/1999 |
| EP | 0 642 173 | 7/1999 |
| EP | 0 727 822 | 8/1999 |
| EP | 0 933 820 | 8/1999 |
| EP | 0 951 072 | 10/1999 |
| EP | 0 971 360 | 1/2000 |
| EP | 0 980 101 | 2/2000 |

| | | |
|---|---|---|
| EP | 0 601 590 | 4/2000 |
| EP | 0 993 037 | 4/2000 |
| EP | 0 836 194 | 5/2000 |
| EP | 0 599 388 | 8/2000 |
| EP | 0 689 252 | 8/2000 |
| EP | 0 606 758 | 9/2000 |
| EP | 0 682 370 | 9/2000 |
| EP | 1 073 121 | 1/2001 |
| EP | 0 726 601 | 9/2001 |
| EP | 0 731 972 | 11/2001 |
| EP | 1 162 663 | 12/2001 |
| EP | 1 162 744 | 12/2001 |
| EP | 1 179 850 | 2/2002 |
| EP | 1 180 799 | 2/2002 |
| EP | 1 191 596 | 3/2002 |
| EP | 1 204 146 | 5/2002 |
| EP | 1 204 147 | 5/2002 |
| EP | 1 209 747 | 5/2002 |
| EP | 0 744 772 | 8/2002 |
| EP | 1 233 454 | 8/2002 |
| EP | 0 725 402 | 9/2002 |
| EP | 1 237 193 | 9/2002 |
| EP | 1 241 708 | 9/2002 |
| EP | 1 253 634 | 10/2002 |
| EP | 0 844 671 | 11/2002 |
| EP | 1 280 205 | 1/2003 |
| EP | 1 288 955 | 3/2003 |
| FR | 2 197 494 | 3/1974 |
| GB | 1 414 228 | 11/1975 |
| JP | H04-176163 A | 6/1922 |
| JP | S62-007149 A | 1/1987 |
| JP | S62-272561 | 11/1987 |
| JP | 02-294076 | 12/1990 |
| JP | 03-171768 | 7/1991 |
| JP | 05-347419 | 12/1993 |
| JP | 08-213624 | 8/1996 |
| JP | H08-213624 A | 8/1996 |
| JP | 08-274277 | 10/1996 |
| JP | H08-316337 A | 11/1996 |
| JP | 09-046688 | 2/1997 |
| JP | 09-082912 | 3/1997 |
| JP | 10-242470 | 9/1998 |
| JP | 11-087649 | 3/1999 |
| JP | 2000-247735 A | 8/2000 |
| JP | 12-274221 A | 9/2000 |
| JP | 12-389106 A | 12/2000 |
| JP | 13-180633 A | 6/2001 |
| JP | 2002-009081 | 1/2002 |
| JP | 2002-083945 | 3/2002 |
| JP | 2002-094027 | 3/2002 |
| JP | 2002-176154 | 6/2002 |
| JP | 2002-246571 | 8/2002 |
| JP | 2002-329795 | 11/2002 |
| JP | 2002-343886 | 11/2002 |
| JP | 2002-353080 | 12/2002 |
| JP | 2003-031693 | 1/2003 |
| JP | 2003-68877 A | 3/2003 |
| JP | 2003-086712 | 3/2003 |
| JP | 2003-100641 | 4/2003 |
| JP | 2003-100900 | 4/2003 |
| JP | 2003-132682 | 5/2003 |
| JP | 2003-203967 | 7/2003 |
| JP | 2003-243528 | 8/2003 |
| JP | 2004-335553 | 11/2004 |
| WO | WO 01/24268 | 4/2001 |
| WO | WO 2005/008778 | 1/2005 |

OTHER PUBLICATIONS

Arimoto, A High-Density Scalable Twin Transistor RAM (TTRAM) With Verify Control for SOI Platform Memory IPs, Nov. 2007, Solid-State Circuits.

Asian Technology Information Program (ATIP) Scoops™, "Novel Capacitorless 1T-DRAM From Single-Gate PD-SOI to Double-Gate FinDRAM", May 9, 2005, 9 pages.

Assaderaghi et al., "A Dynamic Threshold Voltage MOSFET (DTMOS) for Ultra-Low Voltage Operation", IEEE IEDM, 1994, pp. 809-812.

Assaderaghi et al., "A Dynamic Threshold Voltage MOSFET (DTMOS) for Very Low Voltage Operation", IEEE Electron Device Letters, vol. 15, No. 12, Dec. 1994, pp. 510-512.

Assaderaghi et al., "A Novel Silicon-On-Insulator (SOI) MOSFET for Ultra Low Voltage Operation", 1994 IEEE Symposium on Low Power Electronics, pp. 58-59.

Assaderaghi et al., "Dynamic Threshold-Voltage MOSFET (DTMOS) for Ultra-Low Voltage VLSI", IEEE Transactions on Electron Devices, vol. 44, No. 3, Mar. 1997, pp. 414-422.

Assaderaghi et al., "High-Field Transport of Inversion-Layer Electrons and Holes Including Velocity Overshoot", IEEE Transactions on Electron Devices, vol. 44, No. 4, Apr. 1997, pp. 664-671.

Avci, Floating Body Cell (FBC) Memory for 16-nm Technology with Low Variation on Thin Silicon and 10-nm BOX, Oct. 2008, SOI Conference.

Bae, Evaluation of 1T RAM using Various Operation Methods with SOONO (Silicon-On-ONO) device, Dec. 2008, IEDM.

Ban et al., Integration of Back-Gate Doping for 15-nm Node Floating Body Cell (FBC) Memory, Components Research, Process Technology Modeling, presented in the 2010 VLSI Symposium on Jun. 17, 2010.

Ban, A Scaled Floating Body Cell (FBC) Memory with High-k+Metal Gate on Thin-Silicon and Thin-BOX for 16-nm Technology Node and Beyond, Jun. 2008, VLSI Symposium.

Ban, Ibrahim, et al., "Floating Body Cell with Independently-Controlled Double Gates for High Density Memory," Electron Devices Meeting, 2006. IEDM '06, International, IEEE, Dec. 11-13, 2006.

Bawedin, Maryline, et al., A Capacitorless 1T Dram on SOI Based on Dynamic Coupling and Double-Gate Operation, IEEE Electron Device Letters, vol. 29, No. 7, Jul. 2008.

Blagojevic et al., Capacitorless 1T DRAM Sensing Scheme Automatice Reference Generation, 2006, IEEE J.Solid State Circuits.

Blalock, T., "A High-Speed Clamped Bit-Line Current-Mode Sense Amplifier", IEEE Journal of Solid-State Circuits, vol. 26, No. 4, Apr. 1991, pp. 542-548.

Butt, Scaling Limits of Double Gate and Surround Gate Z-RAM Cells, 2007, IEEE Trans. On El. Dev.

Chan et al., "Effects of Floating Body on Double Polysilicon Partially Depleted SOI Nonvolatile Memory Cell", IEEE Electron Device Letters, vol. 24, No. 2, Feb. 2003, pp. 75-77.

Chan, et al., "SOI MOSFET Design for All-Dimensional Scaling with Short Channel, Narrow Width and Ultra-thin Films", IEEE IEDM, 1995, pp. 631-634.

Chi et al., "Programming and Erase with Floating-Body for High Density Low Voltage Flash EEPROM Fabricated on SOI Wafers", Proceedings 1995 IEEE International SOI Conference, Oct. 1995, pp. 129-130.

Cho et al., "Novel DRAM Cell with Amplified Capacitor for Embedded Application", IEEE, Jun. 2009.

Cho, A novel capacitor-less DRAM cell using Thin Capacitively-Coupled Thyristor (TCCT), 2005, IEDM.

Choi et al., Current Flow Mechanism in Schottky-Barrier MOSFET and Application to the 1T-DRAM, 2008, SSDM.

Choi, High Speed Flash Memory and 1T-DRAM on Dopant Segregated Schottky Barrier (DSSB) FinFET SONOS Device for Multi-functional SoC Applications, Dec. 2008, IEDM.

Clarke, Junctionless Transistors Could Simply Chip Making, Say Researchers, EE Times, Feb. 2010, www.eetimes.com/showArticle.jhtml?articleID=223100050.

Colinge, J.P., "An SOI voltage-controlled bipolar-MOS device", IEEE Transactions on Electron Devices, vol. ED-34, No. 4, Apr. 1987, pp. 845-849.

Colinge, Nanowire Transistors Without Junctions, Nature NanoTechnology, vol. 5, 2010, pp. 225-229.

Collaert et al., Optimizing the Readout Bias for the Capacitorless 1T Bulk FinFET RAM Cell, 2009, IEEE EDL.

Collaert, Comparison of scaled floating body RAM architectures, Oct. 2008, SOI Conference.

Ershov, Optimization of Substrate Doping for Back-Gate Control in SOI T-RAM Memory Technology, 2005, SOI Conference.

Ertosun et al., A Highly Scalable Capacitorless Double Gate Quantum Well Single Transistor DRAM: 1T-QW DRAM, 2008, IEEE EDL.

Fazan et al., "A Simple 1-Transistor Capacitor-Less Memory Cell for High Performance Embedded DRAMs", IEEE 2002 Custom Integrated Circuits Conference, Jun. 2002, pp. 99-102.

Fazan, A Highly Manufacturable Capacitor-less 1T-DRAM Concept, 2002, SPIE.

Fazan, et al., "Capacitor-Less 1-Transistor DRAM", 2002 IEEE International SOI Conference, Oct. 2002, pp. 10-13.

Fazan, P., "MOSFET Design Simplifies DRAM", EE Times, May 14, 2002 (3 pages).

Fisch, Beffa, Bassin, Soft Error Performance of Z-RAM Floating Body Memory, 2006, SOI Conference.

Fisch, Carman, Customizing SOI Floating Body Memory Architecture for System Performance and Lower Cost, 2006, SAME.

Fisch, Z-RAM® Ultra-Dense Memory for 90nm and Below, 2006, Hot Chips.

Fossum et al., New Insights on Capacitorless Floating Body DRAM Cells, 2007, IEEE EDL.

Fujita, Array Architectureof Floating Body Cell (FBC) with Quasi-Shielded Open Bit Line Scheme for sub-40nm Node, 2008, SOI Conference.

Furuhashi, Scaling Scenario of Floating Body Cell (FBC) Suppressing Vth Variation Due to Random Dopant Fluctuation, Dec. 2008, SOI Conference.

Furuyama et al., "An Experimental 2-bit/Cell Storage DRAM for Macrocell or Memory-on-Logic Application", IEEE Journal of Solid-State Circuits, vol. 24, No. 2, Apr. 1989, pp. 388-393.

Giffard et al., "Dynamic Effects in SOI MOSFET's", IEEE, 1991, pp. 160-161.

Gupta et al., SPICE Modeling of Self Sustained Operation (SSO) to Program Sub-90nm Floating Body Cells, Oct. 2009, Conf on Simulation of Semiconductor Processes & Devices.

Han et al., Bulk FinFET Unified-RAM (URAM) Cell for Multifunctioning NVM and Capacitorless 1T-DRAM, 2008, IEEE EDL.

Han et al., Partially Depleted SONOS FinFET for Unified RAM (URAM) Unified Function for High-Speed 1T DRAM and Nonvolatile Memory, 2008, IEEE EDL.

Han, Energy Band Engineered Unified-RAM (URAM) for Multi-Functioning 1T-DRAM and NVM, Dec. 2008, IEDM.

Han, Parasitic BJT Read Method for High-Performance Capacitorless 1T-DRAM Mode in Unified RAM, Oct. 2009, IEEE EDL.

Hara, Y., "Toshiba's DRAM Cell Piggybacks on SOI Wafer", EE Times, Jun. 2003.

Hu, C., "SOI (Silicon-on-Insulator) for High Speed Ultra Large Scale Integration", Jpn. J. Appl. Phys. vol. 33 (1994) pp. 365-369, Part 1, No. 1B, Jan. 1994.

Idei et al., "Soft-Error Characteristics in Bipolar Memory Cells with Small Critical Charge", IEEE Transactions on Electron Devices, vol. 38, No. 11, Nov. 1991, pp. 2465-2471.

Ikeda et al., "3-Dimensional Simulation of Turn-off Current in Partially Depleted SOI MOSFETs", IEIC Technical Report, Institute of Electronics, Information and Communication Engineers, 1998, vol. 97, No. 557 (SDM97 186-198), pp. 27-34.

Inoh et al., "FBC (Floating Body Cell) for Embedded DRAM on SOI", 2003 Symposium on VLSI Circuits Digest of Technical Papers, Jun. 2003 (2 pages).

Iyer et al., "SOI MOSFET on Low Cost SPIMOX Substrate", IEEE IEDM, Sep. 1998, pp. 1001-1004.

Jang et al., Highly scalable Z-RAM with remarkably long data retention for DRAM application, Jun. 2009, VLSI.

Jeong et al., "A Capacitor-less 1T DRAM Cell Based on a Surrounding Gate MOSFET with Vertical Channel", Technology Development Team, Technology Development Team, Samsung Electronics Co., Ltd., May 2007.

Jeong et al., "A New Capacitorless 1T DRAm Cell: Surrounding Gate MOSFET with Vertical Channel (SGVC Cell)", IEEE Transactions on Nanotechnology, vol. 6, No. 3, May 2007.

Jeong et al., "Capacitorless DRAM Cell with Highly Scalable Surrounding Gate Structure", Extended Abstracts of the 2006 International Conference on Solid State Devices and Materials, pp. 574-575, Yokohama (2006).

Jeong et al., "Capacitorless Dynamic Random Access Memory Cell with Highly Scalable Surrounding Gate Structure", Japanese Journal of Applied Physics, vol. 46, No. 4B, pp. 2143-2147 (2007).

Kedzierski, J.; "Design Analysis of Thin-Body Silicide Source/Drain Devices", 2001 IEEE International SOI Conference, Oct. 2001, pp. 21-22.

Kim et al., "Chip Level Reliability on SOI Embedded Memory", Proceedings 1998 IEEE International SOI Conference, Oct. 1998, pp. 135-139.

Kuo et al., "A Capacitorless Double-Gate DRAM Cell Design for High Density Applications", IEEE IEDM, Feb. 2002, pp. 843-846.

Kuo et al., "A Capacitorless Double-Gate DRAM Cell", IEEE Electron Device Letters, vol. 23, No. 6, Jun. 2002, pp. 345-347.

Kuo et al., A Capacitorless Double Gate DRAM Technology for Sub 100 nm Embedded and Stand Alone Memory Applications, 2003, IEEE Trans. On El. Dev.

Kwon et al., "A Highly Scalable 4F2 DRAm Cell Utilizing a Doubly Gated Vertical Channel", Extended Abstracts of the 2009 International Conference on Solid State Devices and Materials, UC Berkley, pp. 142-143 Sendai (2009).

Lee et al., "A Novel Pattern Transfer Process for Bonded SOI Gigabit DRAMs", Proceedings 1996 IEEE International SOI Conference, Oct. 1996, pp. 114-115.

Leiss et al., dRAM Design Using the Taper-Isolated Dynamic RAM Cell, IEEE Transactions on Electron Devices, vol. ED-29, No. 4, Apr. 1982, pp. 707-714.

Lin et al., "Opposite Side Floating Gate SOI FLASH Memory Cell", IEEE, Mar. 2000, pp. 12-15.

Liu et al., Surface Generation-Recombination Processes of Gate and STI Oxide Interfaces Responsible For Junction Leakage on SOI, Sep. 2009, ECS Transactions, vol. 25.

Liu, Surface Recombination-Generation Processes of Gate, STI and Buried Oxide Interfaces, Responsible for Junction Leakage, ICSI, May 19, 2009.

Lončar et al., "One of Application of SOI Memory Cell—Memory Array", IEEE Proc. 22nd International Conference on Microelectronics (MIEL 2000), vol. 2, NIS, Serbia, May 14-17, 2000, pp. 455-458.

Lu et al., A Novel Two—Transistor Floating Body/Gate Cell for Low Power Nanoscale Embedded DRAM, 2008, IEEE Trans. On El. Dev.

Ma, et al., "Hot-Carrier Effects in Thin-Film Fully Depleted SOI MOSFET's", IEEE Electron Device Letters, vol. 15, No. 6, Jun. 1994, pp. 218-220.

Malhi et al., "Characteristics and Three-Dimensional Integration of MOSFET's in Small-Grain LPCVD Polycrystalline Silicon", IEEE Transactions on Electron Devices, vol. ED-32, No. 2, Feb. 1985, pp. 258-281.

Malinge, An 8Mbit DRAM Design Using a 1TBulk Cell, 2005, VLSI Circuits.

Mandelman et al, "Floating-Body Concerns for SOI Dynamic Random Access Memory (DRAM)", Proceedings 1996 IEEE International SOI Conference, Oct. 1996, pp. 136-137.

Matsuoka et al., FDC Potential of 6F2 Single Cell Operation in Multi Gbit Memories Confirmed by a Newly Developed Method for Measuring Signal Sense Margin, 2007, IEDM.

Minami, A Floating Body Cell (FBC) fully Compatible with 90nm CMOS Technology(CMOS IV) for 128Mb SOI DRAM, 2005, IEDM.

Mohapatra et al., Effect of Source/Drain Asymmetry on the Performance of Z-RAMÒ Devices, Oct. 2009, SOI conference.

Morishita, A Capacitorless Twin-Transistor Random Access Memory (TTRAM) on SOI, 2005, CICC.

Morishita, F. et al., "A Configurable Enhanced TTRAM Macro for System-Level Power Management Unified Memory", IEEE Journal of Solid -State Circuits, vol. 42, No. 4, pp. 853, Apr. 2007.

Morishita, F., et al., "A 312-MHz 16-Mb Random-Cycle Embedded DRAM Macro With a Power-Down Data Retention Mode for Mobile Applications", J. Solid-State Circuits, vol. 40, No. 1, pp. 204-212, 2005.

Morishita, F., et al., "Dynamic floating body control SOI CMOS for power managed multimedia ULSIs", Proc. CICC, pp. 263-266, 1997.
Morishita, F., et al., "Leakage Mechanism due to Floating Body and Countermeasure on Dynamic Retention Mode of SOI-DRAM", Symposium on VLSI Technology Digest of Technical Papers, pp. 141-142, 1995.
Nagoga, Studying Of Hot Carrier Effect In Floating Body Soi Mosfets By The Transient Charge Pumping Technique, Switzerland 2003.
Nayfeh, A Leakage Current Model for SOI based Floating Body Memory that Includes the Poole-Frenkel Effect, 2008, SOI Conference.
Nemati, A Novel High Density, Low Voltage SRAM Cell with a Vertical NDR Device, 1998, VLSI Tech. Symp.
Nemati, A Novel Thyristor-based SRAM Cell (T-RAM) for High-Speed, Low-Voltage, Giga-scale Memories, 1999, IEDM Conference.
Nemati, Embedded Volatile Memories-Embedded Tutorial: The New Memory Revolution, New Drives Circuits and Systems, ICCAD 2008, Nov. 2008.
Nemati, Fully Planar 0.562µm2 T-RAM Cell in a 130nm SOI CMOS Logic Technology for High-Density High-Performance SRAMs, 2004, IEDM.
Nemati, The New Memory Revolution. New Devices, Circuits and Systems, 2008, ICCAD.
Nemati, Thyristor RAM (T-RAM): A High-Speed High-Density Embedded Memory Technology for Nano-scale CMOS, 2007, Hot Chips.
Nemati, Thyristor-RAM: A Novel Embedded Memory Technology that Outperforms Embedded S RAM/DRAM, 2008, Linley Tech Tour.
Nishiguchi et al., Long Retention of Gain-Cell Dynamic Random Access Memory with Undoped Memory Node, 2007, IEEE EDL.
Oh, Floating Body DRAM Characteristics of Silicon-On-ONO (SOONO) Devices for System-on-Chip (SoC) Applications, 2007, VLSI Symposium.
Ohno et al., "Suppression of Parasitic Bipolar Action in Ultra-Thin-Film Fully-Depleted CMOS/SIMOX Devices by Ar-Ion Implantation into Source/Drain Regions", IEEE Transactions on Electron Devices, vol. 45, No. 5, May 1998, pp. 1071-1076.
Ohsawa et al., "A Memory Using One-Transistor Gain Cell on SOI (FBC) with Performance Suitable for Embedded DRAM's", 2003 Symposium on VLSI Circuits Digest of Technical Papers, Jun. 2003 (4 pages).
Ohsawa et al., "Memory Design Using a One-Transistor Gain Cell on SOI", IEEE Journal of Solid-State Circuits, vol. 37, No. 11, Nov. 2002, pp. 1510-1522.
Ohsawa, A 128Mb Floating Body RAM (FBRAM) on SOI with a Multi-Averaging Scheme of Dummy Cell, 2006 Symposium of VLSI Circuits Digest of Tech Papers, (2006).
Ohsawa, An 18.5ns 128Mb SOI DRAM with a Floating Body Cell, 2005, ISSCC.
Ohsawa, Autonomous Refresh of Floating Body Cell (FBC), Dec. 2008, IEDM.
Ohsawa, Design of a 128-Mb SOI DRAM Using the Floating Body Cell (FBC), Jan. 2006, Solid-State Circuits.
Okhonin, A Capacitor-Less 1T-DRAM Cell, Feb. 2002, Electron Device Letters.
Okhonin, A SOI Capacitor-less 1T-DRAM Concept, 2001, SOI Conference.
Okhonin, Charge Pumping Effects in Partially Depleted SOI MOSFETs, 2003, SOI Conference.
Okhonin, New characterization techniques for SOI and related devices, 2003, ECCTD.
Okhonin, New Generation of Z-RAM, 2007, IEDM.
Okhonin, Principles of Transient Charge Pumping on Partially Depleted SOI MOSFETs, May 2002, Electron Device Letters.
Okhonin, Transient Charge Pumping for Partially and Fully Depleted SOI MOSFETs, 2002, SOI Conference.
Okhonin, Transient effects in PD SOI MOSFETs and potential DRAM applications, 2002, Solid-State Electronics.
Okhonin, Ultra-scaled Z-RAM cell, 2008, SOI Conference.
Okhonin, Z-RAM® (Limits of DRAM), 2009, ESSDERC.

Padilla, Alvaro, et al., "Feedback FET: A Novel Transistor Exhibiting Steep Switching Behavior at Low Bias Voltages," Electron Devices Meeting, 2008. IEDM 2008. IEEE International, Dec. 5-17, 2008.
Park, Fully Depleted Double-Gate 1T-DRAM Cell with NVM Function for High Performance and High Density Embedded DRAM, 2009, IMW.
Pelella et al., "Low-Voltage Transient Bipolar Effect Induced by Dynamic Floating-Body Charging in PD/SOI MOSFETs", Final Camera Ready Art, SOI Conference, Oct. 1995, 2 pages.
Portmann et al., "A SOI Current Memory for Analog Signal Processing at High Temperature", 1999 IEEE International SOI Conference, Oct. 1999, pp. 18-19.
Puget et al., 1T Bulk eDRAM using GIDL Current for High Speed and Low Power applications, 2008, SSDM.
Puget et al., Quantum effects influence on thin silicon film capacitor-less DRAM performance, 2006, SOI Conference.
Puget, FDSOI Floating Body Cell eDRAM Using Gate-Induced Drain-Leakage (GIDL) Write Current for High Speed and Low Power Applications, 2009, IMW.
Ranica et al., 1T-Bulk DRAM cell with improved performances: the way to scaling, 2005, ICMTD.
Ranica, A capacitor-less DRAM cell on 75nm gate length, 16nm thin Fully Depleted SOI device for high density embedded memories, 2004, IEDM.
Ranica, A One Transistor Cell on Bulk Substrate (1T-Bulk) for Low-Cost and High Density eDRAM, 2004, VLSI Symposium.
Rodder et al., "Silicon-On-Insulator Bipolar Transistors", IEEE Electron Device Letters, vol. EDL-4, No. 6, Jun. 1983, pp. 193-195.
Rodriguez, Noel, et al., A-RAM Novel Capacitor-less Dram Memory, SOI Conference, 2009 IEEE International, Oct. 5-8, 2009 pp. 1-2.
Roy, Thyristor-Based Volatile Memory in Nano-Scale CMOS, 2006, ISSCC.
Sailing et al., Reliability of Thyristor Based Memory Cells, 2009, IRPS.
Sasaki et al., Charge Pumping in SOS-MOS Transistors, 1981, IEEE Trans. On El. Dev.
Sasaki et al., Charge Pumping SOS-MOS Transistor Memory, 1978, IEDM.
Schloesser et al., "A 6F2 Buried Wordline DRAM Cell for 40nm and Beyond", IEEE, Qimonda Dresden GmbH & Co., pp. 809-812 (2008).
Shino et al., Floating Body RAM technology and its scalability to 32 nm node and beyond, 2006, IEDM.
Shino et al., Operation Voltage Dependence of Memory Cell Characteristics in Fully Depleted FBC, 2005, IEEE Trans. On El. Dev.
Shino, Fully-Depleted FBC (Floating Body Cell) with Enlarged Signal Window and Excellent Logic Process Compatibility, 2004, IEDM.
Shino, Highly Scalable FBC (Floating Body Cell) with 25nm BOX Structure for Embedded DRAM Applications, 2004, VLSI Symposium.
Sim et al., "Source-Bias Dependent Charge Accumulation in P+-Poly Gate SOI Dynamic Random Access Memory Cell Transistors", Jpn. J. Appl. Phys. vol. 37 (1998) pp. 1260-1263, Part 1, No. 3B, Mar. 1998.
Singh, A 2ns-Read-Latency 4Mb Embedded Floating-Body Memory Macro in 45nm SOI Technology, Feb. 2009, ISSCC.
Sinha et al., "In-Depth Analysis of Opposite Channel Based Charge Injection in SOI MOSFETs and Related Defect Creation and Annihilation", Elsevier Science, Microelectronic Engineering 28, 1995, pp. 383-386.
Song, 55 nm Capacitor-less 1T DRAM Cell Transistor with Non-Overlap Structure, Dec. 2008, IEDM.
Stanojevic et al., "Design of a SOI Memory Cell", IEEE Proc. 21st International Conference on Microelectronics (MIEL '97), vol. 1, NIS, Yugoslavia, Sep. 14-17, 1997, pp. 297-300.
Su et al., "Studying the Impact of Gate Tunneling on Dynamic Behaviors of Partially-Depleted SOI CMOS Using BSIMPD", IEEE Proceedings of the International Symposium on Quality Electronic Design (ISQED '02), Apr. 2002 (5 pages).

Suma et al., "An SOI-DRAM with Wide Operating Voltage Range by CMOS/SIMOX Technology", 1994 IEEE International Solid-State Circuits Conference, pp. 138-139.

Tack et al., "The Multi-Stable Behaviour of SOI-NMOS Transistors at Low Temperatures", Proc. 1988 SOS/SOI Technology Workshop (Sea Palms Resort, St. Simons Island, GA, Oct. 1988), p. 78.

Tack et al., "The Multistable Charge Controlled Memory Effect in SOI Transistors at Low Temperatures", IEEE Workshop on Low Temperature Electronics, Aug. 7-8, 1989, University of Vermont, Burlington, pp. 137-141.

Tack et al., "The Multistable Charge-Controlled Memory Effect in SOI MOS Transistors at Low Temperatures", IEEE Transactions on Electron Devices, vol. 37, No. 5, May 1990, pp. 1373-1382.

Tack, et al., "An Analytical Model for the Misis Structure in SOI MOS Devices", Solid-State Electronics vol. 33, No. 3, 1990, pp. 357-364.

Tanabe et al., A 30-ns. 64-MB DRAM with Built-in-Self-Test and Self-Repair Function, IEEE Journal of Solid State Circuits, vol. 27, No. 11, Nov. 1992, pp. 1525-1533.

Tanaka et al., "Scalability Study on a Capacitorless 1T-DRAM: From Single-gate PD-SOI to Double-gate FINDRAM", 2004 IEEE, 4 pages.

Tang, Poren, Highly Scalable Capacitorless DRAM Cell on Thin-Body with Band-gap Engineered Source and Drain, Extended Abstracts of the 2009 ICSSDM, Sendai, 2009, pp. 144-145.

Terauchi et al., "Analysis of Floating-Body-Induced Leakage Current in 0.15μ m SOI DRAM", Proceedings 1996 IEEE International SOI Conference, Oct. 1996, pp. 138-139.

Thomas et al., "An SOI 4 Transistors Self-Refresh Ultra-Low-Voltage Memory Cell", IEEE, Mar. 2003, pp. 401-404.

Tomishima, et al., "A Long Data Retention SOI DRAM with the Body Refresh Function", IEICE Trans. Electron., vol. E80-C, No. 7, Jul. 1997, pp. 899-904.

Tsaur et al., "Fully Isolated Lateral Bipolar-MOS Transistors Fabricated in Zone-Melting-Recrystallized Si Films on SiO2", IEEE Electron Device Letters, vol. EDL-4, No. 8, Aug. 1983, pp. 269-271.

Tu, et al., "Simulation of Floating Body Effect in SOI Circuits Using BSIM3SOI", Proceedings of Technical Papers (IEEE Cat No. 97TH8303), Jun. 1997, pp. 339-342.

Villaret et al., "Mechanisms of Charge Modulation in the Floating Body of Triple-Well nMOSFET Capacitor-less DRAMs", Proceedings of the INFOS 2003, Insulating Films on Semiconductors, 13th Bi-annual Conference, Jun. 18-20, 2003, Barcelona (Spain), (4 pages).

Villaret et al., "Triple-Well nMOSFET Evaluated as a Capacitor-Less DRAM Cell for Nanoscale Low-Cost & High Density Applications", Handout at Proceedings of 2003 Silicon Nanoelectronics Workshop, Jun. 8-9, 2003, Kyoto, Japan (2 pages).

Villaret et al., Further Insight into the Physics and Modeling of Floating Body Capacitorless DRAMs, 2005, IEEE Trans. On El. Dev.

Wang et al., A Novel 4.5F2 Capacitorless Semiconductor Memory Device, 2008, IEEE EDL.

Wann et al., "A Capacitorless DRAM Cell on SOI Substrate", IEEE IEDM, 1993, pp. 635-638.

Wann et al., "High-Endurance Ultra-Thin Tunnel Oxide in MONOS Device Structure for Dynamic Memory Application", IEEE Electron Device Letters, vol. 16, No. 11, Nov. 1995, pp. 491-493.

Wei, A., "Measurement of Transient Effects in SOI DRAM/SRAM Access Transistors", IEEE Electron Device Letters, vol. 17, No. 5, May 1996, pp. 193-195.

Wouters, et al., "Characterization of Front and Back Si-SiO2 Interfaces in Thick- and Thin-Film Silicon-on-Insulator MOS Structures by the Charge-Pumping Technique", IEEE Transactions on Electron Devices, vol. 36, No. 9, Sep. 1989, pp. 1746-1750.

Wu, Dake, "Performance Improvement of the Capacitorless DRAM Cell with Quasi-SOI Structure Based on Bulk Substrate," Extended Abstracts of the 2009 ICSSDM, Sendai, 2009, pp. 146-147.

Yamanaka et al., "Advanced TFT SRAM Cell Technology Using a Phase-Shift Lithography", IEEE Transactions on Electron Devices, vol. 42, No. 7, Jul. 1995, pp. 1305-1313.

Yamauchi et al., "High-Performance Embedded SOI DRAM Architecture for the Low-Power Supply", IEEE Journal of Solid-State Circuits, vol. 35, No. 8, Aug. 2000, pp. 1169-1178.

Yamawaki, M., "Embedded DRAM Process Technology", Proceedings of the Symposium on Semiconductors and Integrated Circuits Technology, 1998, vol. 55, pp. 38-43.

Yang, Optimization of Nanoscale Thyristors on SOI for High-Performance High-Density Memories, 2006, SOI Conference.

Yoshida et al., "A Design of a Capacitorless 1-T-DRAM Cell Using Gate-induced Drain Leakage (GIDL) Current for Low-Power and High-speed Embedded Memory", 2003 IEEE, 4 pages.

Yoshida et al., "A Study of High Scalable DG-FinDRAM", IEEE Electron Device Letters, vol. 26, No. 9, Sep. 2005, pp. 655-657.

Yoshida et al., A Capacitorless 1T-DRAM Technology Using GIDL Current for Low Power and High Speed Embedded Memory, 2006, IEEE Trans. On El. Dev.

Yu et al., Hot-Carrier Effect in Ultra-Thin-Film (UTF) Fully-Depleted SOI MOSEFET's, 54th Annual Device Research Conference Digest (Cat. No. 96TH8193), Jun. 1996, pp. 22-23.

Yu et al., "Hot-Carrier-Induced Degradation in Ultra-Thin-Film Fully-Depleted SOI MOSFETs", Solid-State Electronics, vol. 39, No. 12, 1996, pp. 1791-1794.

Yu et al., "Interface Characterization of Fully-Depleted SOI MOSFET by a Subthreshold I-V Method", Proceedings 1994 IEEE International SOI Conference, Oct. 1994, pp. 63-64.

Yun et al., Analysis of Sensing Margin in SOONO Device for the Capacitor-less RAM Applications, 2007, SOI Conference.

Zhou, Physical Insights on BJT-Based 1T DRAM Cells, IEEE Electron Device Letters, vol. 30, No. 5, May 2009.

* cited by examiner

TECHNIQUES FOR CONTROLLING A SEMICONDUCTOR MEMORY DEVICE

CROSS-REFERENCE TO RELATED APPLICATIONS

This patent application claims priority to U.S. Provisional Patent Application No. 61/304,067, filed Feb. 12, 2010, which is hereby incorporated by reference herein in its entirety.

FIELD OF THE DISCLOSURE

The present disclosure relates generally to semiconductor memory devices and, more particularly, to techniques for controlling a semiconductor memory device.

BACKGROUND OF THE DISCLOSURE

The semiconductor industry has experienced technological advances that have permitted increases in density and/or complexity of semiconductor memory devices. Also, the technological advances have allowed decreases in power consumption and package sizes of various types of semiconductor memory devices. There is a continuing trend to employ and/or fabricate advanced semiconductor memory devices using techniques, materials, and devices that improve performance, reduce leakage current, and enhance overall scaling. Silicon-on-insulator (SOI) and bulk substrates are examples of materials that may be used to fabricate such semiconductor memory devices. Such semiconductor memory devices may include, for example, partially depleted (PD) devices, fully depleted (FD) devices, multiple gate devices (e.g., double, triple gate, or surrounding gate), and Fin-FET devices.

A semiconductor memory device may include a memory cell having a memory transistor with an electrically floating body region wherein electrical charge may be stored. When excess majority electrical charges carriers are stored in the electrically floating body region, the memory cell may store a logic high (e.g., binary "1" data state). When the electrical floating body region is depleted of majority electrical charge carriers, the memory cell may store a logic low (e.g., binary "0" data state). Also, a semiconductor memory device may be fabricated on silicon-on-insulator (SOI) substrates or bulk substrates (e.g., enabling body isolation). For example, a semiconductor memory device may be fabricated as a three-dimensional (3-D) device (e.g., a multiple gate device, a Fin-FET device, and a vertical pillar device).

In one conventional technique, the memory cell of the semiconductor memory device may be read by applying bias signals to a source/drain region and/or a gate of the memory transistor. As such, a conventional reading technique may involve sensing an amount of current provided/generated by/in the electrically floating body region of the memory cell in response to the application of the source/drain region or gate bias signals to determine a data state stored in the memory cell. For example, the memory cell may have two or more different current states corresponding to two or more different logical states (e.g., two different current conditions/states corresponding to two different logic states: a binary "0" data state and a binary "1" data state).

Often, conventional reading operations may lead to relatively large power consumption and large voltage potential swings which may cause disturbances to unselected memory cells in the semiconductor memory device. Also, pulsing between positive and negative gate biases during read operations may reduce a net quantity of majority charge carriers in the electrically floating body region of the memory cell in the semiconductor memory device, which, in turn, may result in an inaccurate determination of the state of the memory cell. Furthermore, in the event that a bias signal is applied to the gate of the memory transistor that is below a threshold voltage potential of the memory transistor, a channel of minority charge carriers beneath the gate may be eliminated. However, some of the minority charge carriers may remain "trapped" in interface defects. Indeed, some of the trapped minority charge carriers may recombine with majority charge carriers, which may be attracted to the gate as a result of the applied bias. As a result, the net quantity of majority charge carriers in the electrically floating body region may be reduced. This phenomenon, which is typically characterized as charge pumping, is problematic because the net quantity of majority charge carriers may be reduced in the electrically floating body region of the memory cell, which, in turn, may result in an inaccurate determination of the state of the memory cell.

In view of the foregoing, it may be understood that there may be significant problems and shortcomings associated with conventional techniques for controlling a semiconductor memory devices.

SUMMARY OF THE DISCLOSURE

Techniques for controlling a semiconductor memory device are disclosed. In one particular exemplary embodiment, the techniques may be realized as a method for controlling a semiconductor memory device comprising applying a plurality of voltage potentials to a plurality of memory cells arranged in an array of rows and columns. Applying the plurality of voltage potentials to the plurality of memory cells may comprise applying a first voltage potential to a first memory cell in a row of the array via a first respective bit line and a first switch transistor. Applying the plurality of voltage potentials to the plurality of memory cells may also comprise applying a second voltage potential to a second memory cell in the row of the array via a second respective bit line and a second switch transistor. Applying the plurality of voltage potentials to the plurality of memory cells may further comprise applying a third voltage potential to at least one third memory cell in the row of the array via at least one third respective bit line and at least one third switch transistor, wherein the at least one third memory cell may be located between the first memory cell and the second memory cell in the row of the array.

In accordance with other aspects of this particular exemplary embodiment, the first switch transistor may couple the first memory cell to first data sense amplifier circuitry.

In accordance with further aspects of this particular exemplary embodiment, the second switch transistor may couple the second memory cell to second data sense amplifier circuitry.

In accordance with additional aspects of this particular exemplary embodiment, the at least one third switch transistor may couple the at least one third memory cell to the first data sense amplifier circuitry or the second data sense amplifier circuitry.

In accordance with yet another aspect of this particular exemplary embodiment, the first voltage potential, the second voltage potential, and the third voltage potential may be simultaneously applied by the first data sense amplifier circuitry or the second data sense amplifier circuitry.

In accordance with other aspects of this particular exemplary embodiment, the first voltage potential, the second voltage potential, and the third voltage potential may be equal.

In accordance with further aspects of this particular exemplary embodiment, the first voltage potential, the second voltage potential, and the third voltage potential may be equal to a masking operation voltage potential.

In accordance with additional aspects of this particular exemplary embodiment, the first voltage potential may be applied by first data sense amplifier circuitry to determine a data state stored in the first memory cell.

In accordance with yet another aspect of this particular exemplary embodiment, the second voltage potential may be applied by second data sense amplifier circuitry to determine a data state stored in the second memory cell.

In accordance with other aspects of this particular exemplary embodiment, the third voltage potential may be applied by the first data sense amplifier circuitry or the second data sense amplifier circuitry to mask the at least one third memory cell from disturbance.

In accordance with further aspects of this particular exemplary embodiment, the third voltage potential may be applied to at least two of the at least one third memory cell in the row of the array via at least two of the at least one third respective bit line.

In accordance with additional aspects of this particular exemplary embodiment, the at least one third respective bit line may be electrically floating after the application of the third voltage potential.

In accordance with yet another aspect of this particular exemplary embodiment, the third voltage potential may be maintained via at least one respective driver transistor.

In another particular exemplary embodiment, the techniques may be realized as a semiconductor memory device comprising a plurality of memory cells arranged in an array of rows and columns. At least one of the plurality of memory cells may comprise a first region coupled to a respective source line of the array. The at least one of the plurality of memory cells may also comprise a second region coupled to a respective bit line of the array, wherein the respective bit line of the array may be coupled to data sense amplifier circuitry via a switch transistor. The at least one of the plurality of memory cells may further comprise a body region spaced apart from and capacitively coupled to a respective word line of the array, wherein the body region may be electrically floating and disposed between the first region and the second region. The at least one of the plurality of memory cells may further comprise a third region coupled to a respective carrier injection line of the array, wherein the third region may be disposed adjacent to the first region or the second region.

In accordance with other aspects of this particular exemplary embodiment, the respective bit line may be one of a plurality of bit lines in the array that may be coupled to the data sense amplifier circuitry.

In accordance with further aspects of this particular exemplary embodiment, the data sense amplifier circuitry may be one of a plurality of data sense amplifier circuits in the array.

In accordance with additional aspects of this particular exemplary embodiment, at least some of the plurality of data sense amplifier circuits may be configured on opposite sides of the array.

In accordance with yet another aspect of this particular exemplary embodiment, at least some of the plurality of data sense amplifier circuits may be alternatively coupled to the plurality of memory cells of the array.

In accordance with other aspects of this particular exemplary embodiment, at least some of the plurality of data sense amplifier circuits may be alternatively coupled to a pair of memory cells in the row of the array.

In accordance with further aspects of this particular exemplary embodiment, at least some of the plurality of data sense amplifier circuits may be alternatively coupled to a single memory cell in the row of the array.

In accordance with additional aspects of this particular exemplary embodiment, the switch transistor may be one of a plurality of switch transistors in the array that may be coupled to the data sense amplifier circuitry.

In accordance with yet another aspect of this particular exemplary embodiment, the semiconductor memory device further comprises a driver transistor coupling the respective bit line of the array to a power source.

In accordance with other aspects of this particular exemplary embodiment, the driver transistor may be one of a plurality of driver transistors in the array.

The present disclosure will now be described in more detail with reference to exemplary embodiments thereof as shown in the accompanying drawings. While the present disclosure is described below with reference to exemplary embodiments, it should be understood that the present disclosure is not limited thereto. Those of ordinary skill in the art having access to the teachings herein will recognize additional implementations, modifications, and embodiments, as well as other fields of use, which are within the scope of the present disclosure as described herein, and with respect to which the present disclosure may be of significant utility.

BRIEF DESCRIPTION OF THE DRAWINGS

In order to facilitate a fuller understanding of the present disclosure, reference is now made to the accompanying drawings, in which like elements are referenced with like numerals. These drawings should not be construed as limiting the present disclosure, but are intended to be exemplary only.

DETAILED DESCRIPTION OF EXEMPLARY EMBODIMENTS

Figure 1:
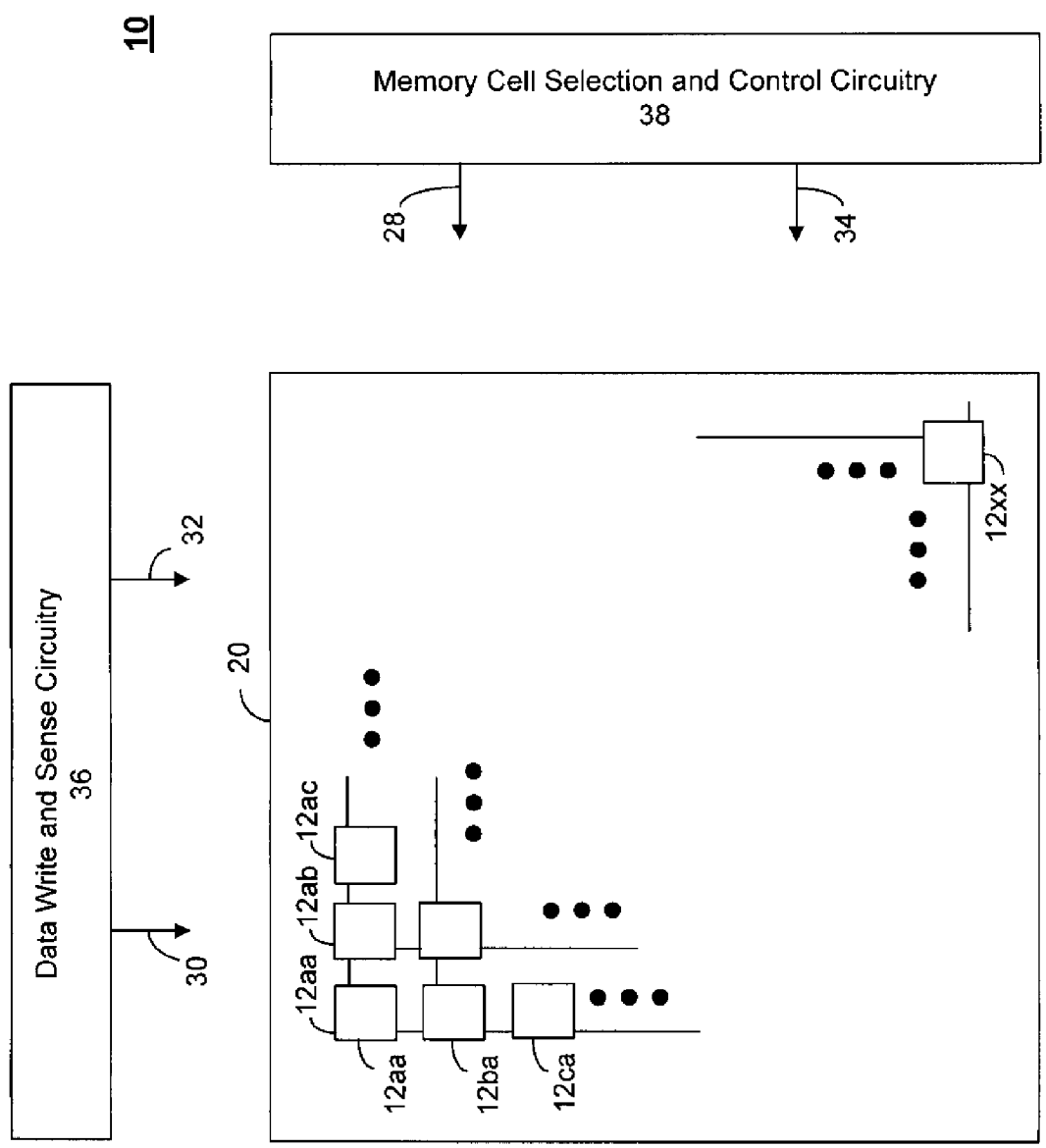
FIG. 1 shows a block diagram of a semiconductor memory device including a memory cell array, data write and sense circuitry, and memory cell selection and control circuitry in accordance with an embodiment of the present disclosure.

Referring to FIG. 1, there is shown a block diagram of a semiconductor memory device 10 comprising a memory cell array 20, data write and sense circuitry 36, and memory cell selection and control circuitry 38 in accordance with an embodiment of the present disclosure. The memory cell array 20 may comprise a plurality of memory cells 12 each coupled to the memory cell selection and control circuitry 38 via a word line (WL) 28 and a carrier injection line (EP) 34, and to the data write and sense circuitry 36 via a source line (EN) 32 and a bit line (CN) 30. It may be appreciated that the source line (EN) 32 and the bit line (CN) 30 are designations used to distinguish between two signal lines and they may be used interchangeably.

The data write and sense circuitry 36 may read data from and may write data to selected memory cells 12. In an exemplary embodiment, the data write and sense circuitry 36 may include a plurality of data sense amplifier circuits. Each data sense amplifier circuit may receive at least one bit line (CN) 30 and a current or voltage reference signal. For example, each data sense amplifier circuit may be a cross-coupled type sense amplifier to sense a data state stored in a memory cell 12. The data write and sense circuitry 36 may include at least one multiplexer that may couple the data sense amplifier circuit to at least one bit line (CN) 30. In an exemplary embodiment, the multiplexer may couple a plurality of bit lines (CN) 30 to a data sense amplifier circuit.

Each data sense amplifier circuit may employ voltage and/or current sensing circuitry and/or techniques. In an exemplary embodiment, each data sense amplifier circuit may employ current sensing circuitry and/or techniques. For example, a current sense amplifier may compare current from a selected memory cell 12 to a reference current (e.g., the current of one or more reference cells). From that comparison, it may be determined whether the selected memory cell 12 stores a logic high (e.g., binary "1" data state) or a logic low (e.g., binary "0" data state). It may be appreciated by one having ordinary skill in the art that various types or forms of the data write and sense circuitry 36 (including one or more sense amplifiers, using voltage or current sensing techniques, to sense a data state stored in a memory cell 12) may be employed to read data stored in the memory cells 12.

The memory cell selection and control circuitry 38 may select and/or enable one or more predetermined memory cells 12 to facilitate reading data therefrom by applying control signals on one or more word lines (WL) 28 and/or carrier injection lines (EP) 34. The memory cell selection and control circuitry 38 may generate such control signals from address signals, for example, row address signals. Moreover, the memory cell selection and control circuitry 38 may include a word line decoder and/or driver. For example, the memory cell selection and control circuitry 38 may include one or more different control/selection techniques (and circuitry thereof) to select and/or enable one or more predetermined memory cells 12. Notably, all such control/selection techniques, and circuitry thereof, whether now known or later developed, are intended to fall within the scope of the present disclosure.

In an exemplary embodiment, the semiconductor memory device 10 may implement a two step write operation whereby all the memory cells 12 in a row of memory cells 12 may be written to a predetermined data state by first executing a "clear" or a logic low (e.g., binary "0" data state) write operation, whereby all of the memory cells 12 in the row of memory cells 12 are written to logic low (e.g., binary "0" data state). Thereafter, selected memory cells 12 in the row of memory cells 12 may be selectively written to the predetermined data state (e.g., a logic high (binary "1" data state)). The semiconductor memory device 10 may also implement a one step write operation whereby selective memory cells 12 in a row of memory cells 12 may be selectively written to either a logic high (e.g., binary "1" data state) or a logic low (e.g., binary "0" data state) without first implementing a "clear" operation. The semiconductor memory device 10 may employ any of the exemplary writing, preparation, holding, refresh, and/or reading techniques described herein.

The memory cells 12 may comprise N-type, P-type and/or both types of transistors. Circuitry that is peripheral to the memory cell array 20 (for example, sense amplifiers or comparators, row and column address decoders, as well as line drivers (not illustrated herein)) may also include P-type and/or N-type transistors. Regardless of whether P-type or N-type transistors are employed in memory cells 12 in the memory cell array 20, suitable voltage potentials (for example, positive or negative voltage potentials) for reading from the memory cells 12 will be described further herein.

Figure 2:
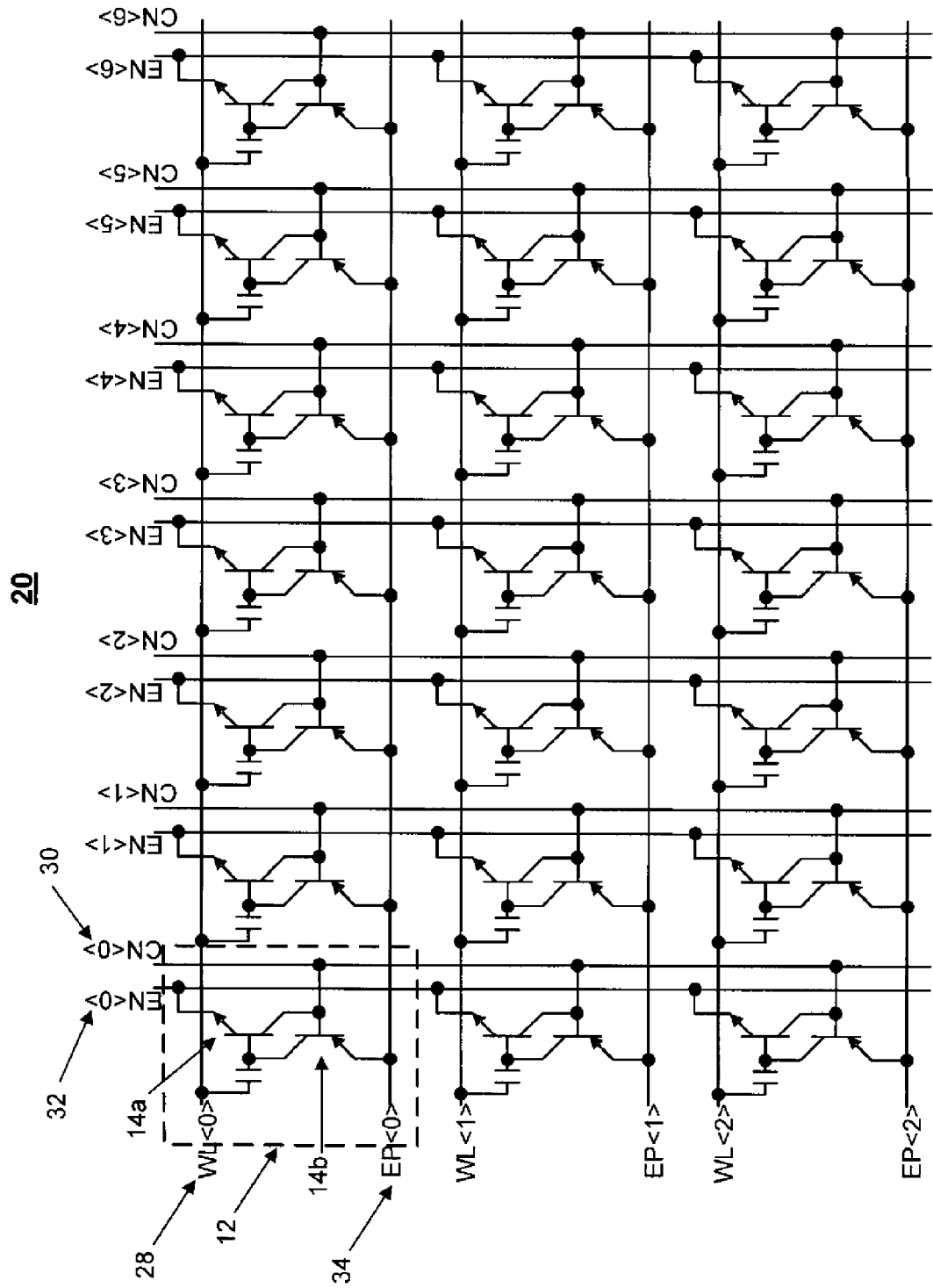
FIG. 2 shows a schematic diagram of at least a portion of a memory cell array having a plurality of memory cells in accordance with an embodiment of the present disclosure.

Referring to FIG. 2, there is shown a memory cell array 20 having a plurality of memory cells 12 in accordance with an embodiment of the present disclosure. Each of the memory cells 12 may comprise a first bipolar transistor 14a and a second bipolar transistor 14b coupled to each other. For example, the first bipolar transistor 14a and/or the second bipolar transistor 14b may be an NPN bipolar transistor or a PNP bipolar transistor. As illustrated in FIG. 2, the first bipolar transistor 14a may be an NPN bipolar transistor and the second bipolar transistor 14b may be a PNP bipolar transistor. In another exemplary embodiment, the first memory transistor 14a may be a PNP bipolar transistor and the second memory transistor 14b may be an NPN bipolar transistor. The memory cells 12 may be coupled to a respective word line (WL) 28, a respective bit line (CN) 30, a respective source line (EN) 32, and/or a respective carrier injection line (EP) 34. Data may be written to or read from a selected memory cell 12 by applying suitable control signals to a selected word line (WL) 28, a selected bit line (CN) 30, a selected source line (EN) 32, and/or a selected carrier injection line (EP) 34. In an exemplary embodiment, the word line (WL) 28 may extend horizontally parallel to the carrier injection line (EP) 34. In another exemplary embodiment, the bit line (CN) 30 may extend vertically parallel to the source line (EN) 32.

In an exemplary embodiment, one or more respective bit line (CN) 30 may be coupled to data sense amplifier circuitry of the data write and sense circuitry 36. For example, one or more control signals may be applied to one or more selected memory cells 12 via a selected word line (WL) 28, a selected bit line (CN) 30, a selected source line (EN) 32, and/or a selected carrier injection line (EP) 34. A voltage potential and/or a current may be generated by the one or more selected memory cells 12 and outputted to the data sense amplifier circuitry of the data write and sense circuitry 36 via a corresponding bit line (CN) 30.

Also, a data state may be written to one or more selected memory cells 12 by applying one or more control signals via one or more corresponding bit lines (CN) 30. The one or more control signals applied via the corresponding bit lines (CN) 30 may control the second bipolar transistor 14b of the memory cell 12 in order to write a desired data state to the memory cell 12. In the event that a data state is read from and/or written to the memory cell 12 via the bit line (CN) 30, then the bit line (CN) 30 may be coupled to the data sense amplifier circuitry of the data write and sense circuitry 36 while the source line (EN) 32 may be separately controlled via a voltage/current source (e.g., a voltage/current driver) of the data write and sense circuitry 36. In an exemplary embodiment, the data sense amplifier circuitry of the data write and sense circuitry 36 and the voltage/current source of the data write and sense circuitry 36 may be configured on opposite sides of the memory cell array 20. In another exemplary embodiment, the data write and sense circuitry 36 may include a plurality of data sense amplifier circuits configured on opposite sides of the memory cell array 20.

In the event that the source line (EN) 32 is coupled to the data sense amplifier circuitry of the data write and sense circuitry 36, a voltage potential and/or current generated by the one or more selected memory cells 12 may be outputted to the data sense amplifier circuitry of the data write and sense circuitry 36 via the corresponding source line (EN) 32. Also, a data state may be written to one or more selected memory cells 12 by applying one or more control signals via one or more corresponding bit lines (CN) 30. The one or more control signals applied via the corresponding bit lines (CN) 30 may control the second bipolar transistor 14b of the memory cell 12 in order to write a desired data state to the memory cell 12. For example, the bit line (CN) 30 and the source line (EN) 32 may be coupled to disparate subcircuits (e.g., drivers and/or sense amplifiers) of the data write and sense circuitry 36 configured on opposite sides of the memory cell array 20. In an exemplary embodiment, the bit line (CN) 30 may be coupled to a driver and/or sense amplifier circuitry of the data write and sense circuitry 36, while the source line (EN) 32 may be coupled to a driver and/or sense amplifier circuitry of the data write and sense circuitry 36. Also, the driver and/or the data sense amplifier circuitry coupled to the bit line (CN) 30 and the driver and/or the data sense amplifier circuitry coupled to the source line (EN) 32 may be configured on opposite sides of the memory cell array 20. By reading a data state via the source line (EN) 32 and writing a data state via the bit line (CN) 30, the resistance at the memory cell 12 may be reduced because the source line (EN) 32 and the bit line (CN) 30 are driven separately.

Figure 3:
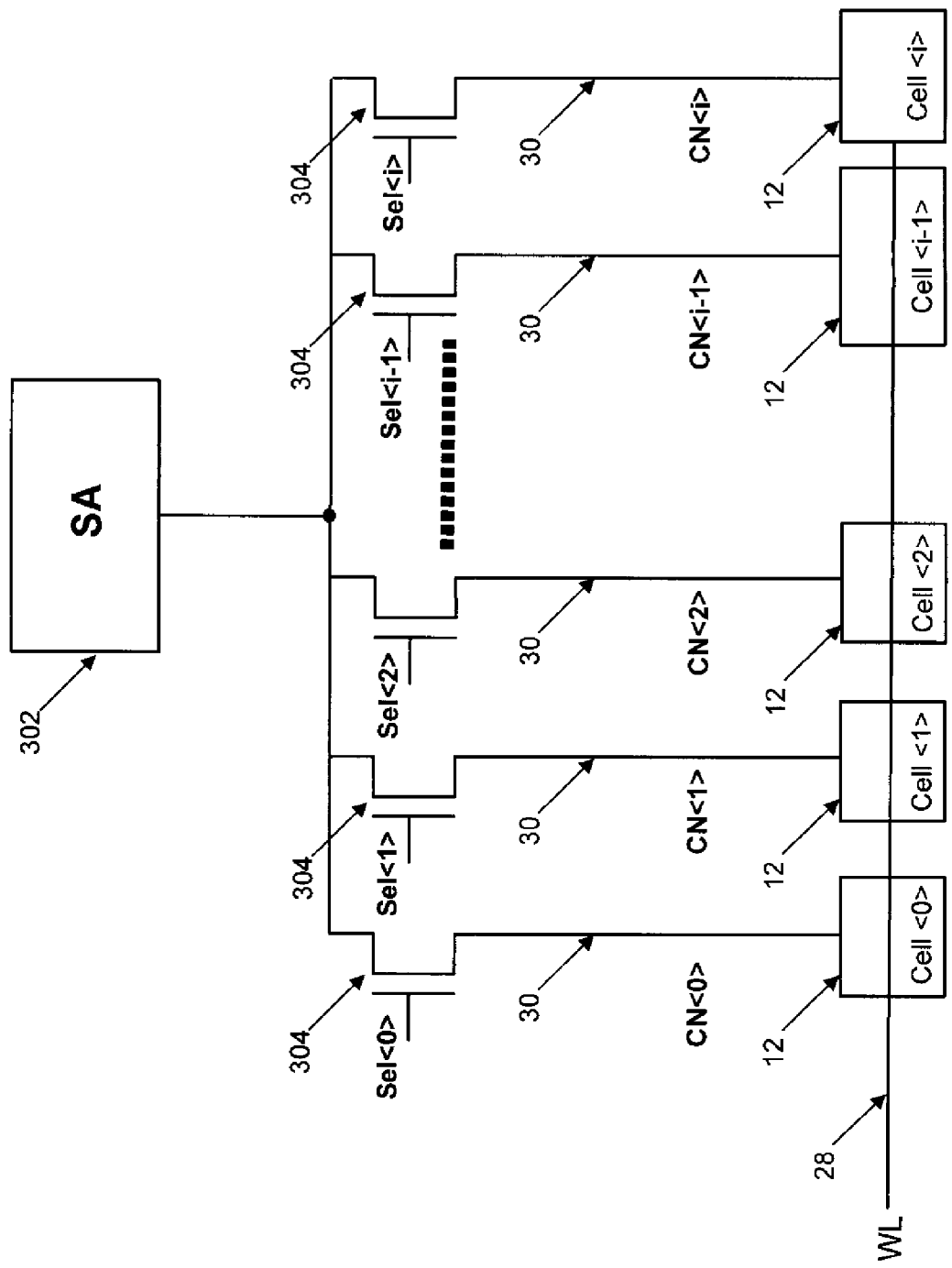
FIG. 3 shows a schematic diagram of a semiconductor memory device having a plurality of memory cells coupled to data sense amplifier circuitry in accordance with an embodiment of the present disclosure.

Referring to FIG. 3, there is shown a schematic diagram of a semiconductor memory device 10 having a plurality of memory cells 12 coupled to data sense amplifier circuitry 302 in accordance with an embodiment of the present disclosure. As illustrated in FIG. 3, a plurality of memory cells 12 (e.g., memory cell <0>, memory cell <1>, memory cell <2> . . . memory cell <i−1> and memory cell <i>) may be coupled to the data sense amplifier circuitry 302 via a plurality of corresponding bit lines (CN) 30 (e.g., CN<0>, CN<1>, CN<2>, . . . CN<i−1>, and CN<1>) and a plurality of corresponding switch transistors 304. For example, a predetermined number of memory cells 12 (e.g., i number of memory cells 12) may be coupled to the data sense amplifier circuitry 302. In an exemplary embodiment, four memory cells 12, eight memory cells 12, sixteen memory cells 12, thirty-two memory cells 12, sixty-four memory cells 12, and/or etc. may be coupled to the data sense amplifier circuitry 302.

The switch transistor 304 may be activated to couple a corresponding memory cell 12 to the data sense amplifier circuitry 302 via a corresponding bit line (CN) 30. The switch transistor 304 may be an N-type bipolar transistor or a P-type bipolar transistor. Also, the switch transistor 304 may be an N-channel metal-oxide semiconductor field effect transistor (MOSFET) or a P-channel metal-oxide semiconductor field effect transistor (MOSFET).

Figure 4:
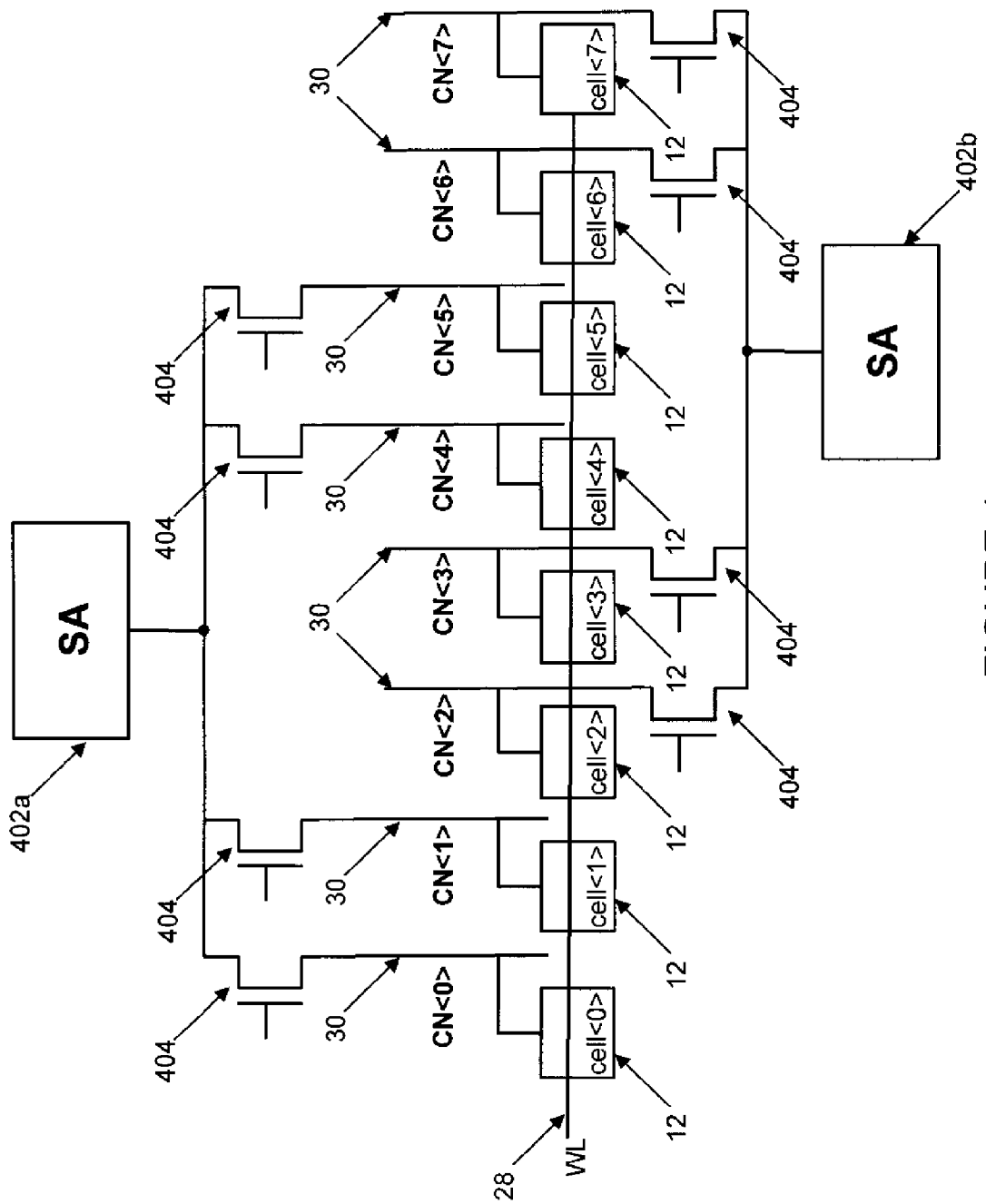
FIG. 4 shows a schematic diagram of a semiconductor memory device having a plurality of memory cells coupled to a plurality of data sense amplifier circuits in accordance with an embodiment of the present disclosure.

Referring to FIG. 4, there is shown a schematic diagram of a semiconductor memory device 10 having a plurality of memory cells 12 coupled to a plurality of data sense amplifier circuits 402a and 402b in accordance with an embodiment of the present disclosure. A plurality of memory cells 12 (e.g., memory cell <0>, memory cell <1>, memory cell <2>, memory cell <3>, memory cell <4>, memory cell <5>, memory cell <6>, and memory cell <7>) may be coupled to the plurality of data sense amplifier circuits 402a and 402b. The plurality of memory cells 12 may be arranged in a row in the memory cell array 20. Each of the memory cells 12 may be coupled to data sense amplifier circuitry 402a or 402b via a corresponding bit line (CN) 30 and a corresponding switch transistor 404. The data sense amplifier circuitry 402 may determine a data state (e.g., logic high (binary "1" data state) or logic low (binary "0" data state)) stored in a memory cell 12 by activating a corresponding switch transistor 404.

The plurality of data sense amplifier circuits 402a and 402b may be configured on opposite sides of the memory cell array 20. For example, each data sense amplifier circuit 402a or 402b may be alternatively coupled to the plurality of memory cells 12. For example, the data sense amplifier circuitry 402a may be coupled to the first pair of memory cells 12 (e.g., memory cell <0> and the memory cell <1>). Alternatively, the data sense amplifier circuitry 402b may be coupled to the second pair of memory cells 12 (e.g., memory cell <2> and the memory cell <3>). Subsequently, the data sense amplifier circuitry 402a may be coupled to the third pair of memory cells 12 (e.g., memory cell <4> and the memory cell <5>). The data sense amplifier circuitry 402b may be coupled to the fourth pair of memory cells 12 (e.g., memory cell <6> and the memory cell <7>).

Figure 5:
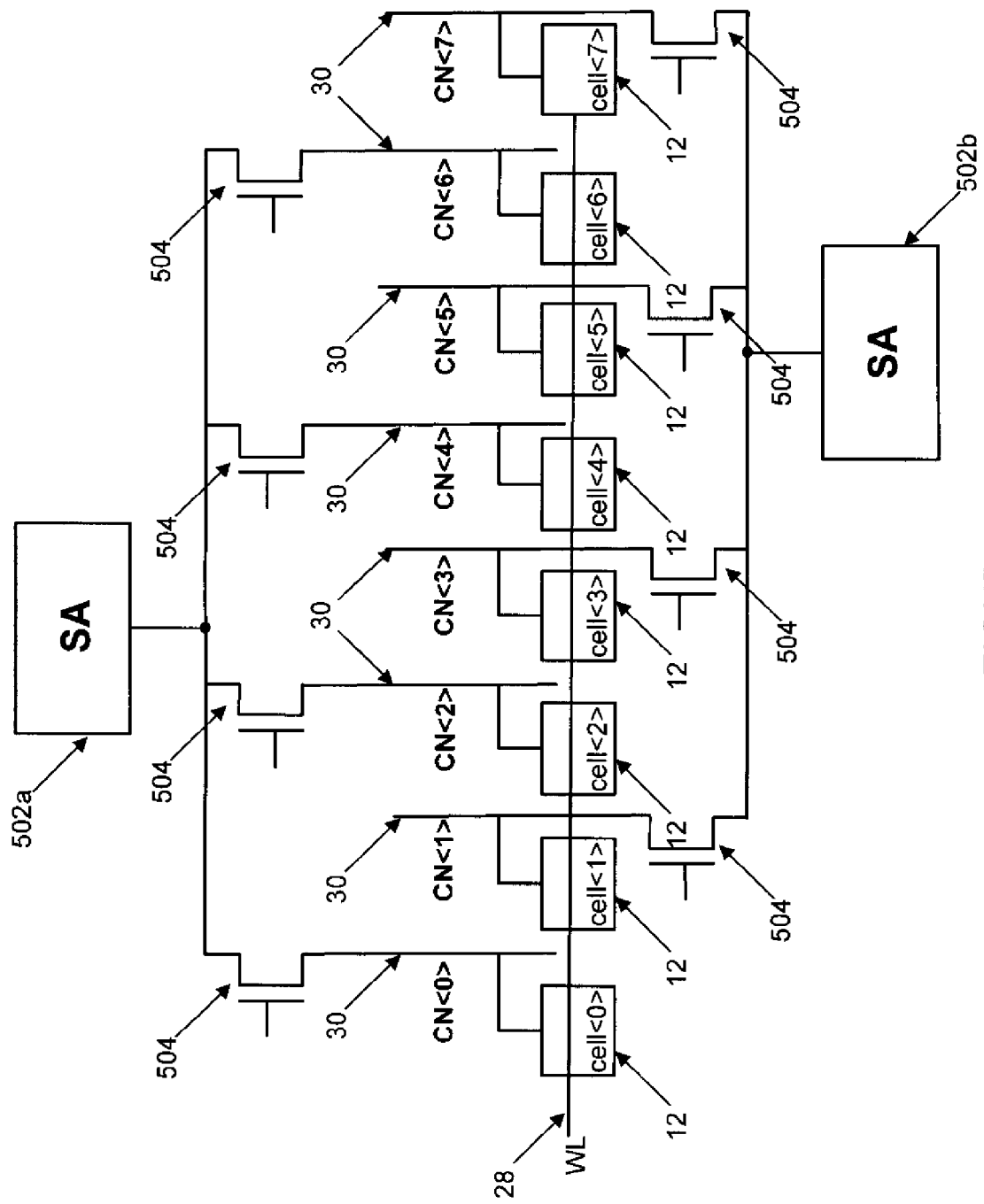
FIG. 5 shows a schematic diagram of a semiconductor memory device having a plurality of memory cells coupled to a plurality of data sense amplifier circuits in accordance with another embodiment of the present disclosure.

Referring to FIG. 5, there is shown a schematic diagram of a semiconductor memory device 10 having a plurality of memory cells 12 coupled to a plurality of data sense amplifier circuits 502 in accordance with another embodiment of the present disclosure. A plurality of memory cells 12 (e.g., memory cell <0>, memory cell <1>, memory cell <2>, memory cell <3>, memory cell <4>, memory cell <5>, memory cell <6>, and memory cell <7>) may be coupled to a plurality of data sense amplifier circuits 502a and 502b. The plurality of memory cells 12 may be arranged in a row in the memory cell array 20. Each of the memory cells 12 may be coupled to data sense amplifier circuitry 502a or 502b via a corresponding bit line (CN) 30 and a corresponding switch transistor 504. The data sense amplifier circuitry 502 may determine a data state (e.g., logic high (binary "1" data state) or logic low (binary "0" data state)) stored in one or more memory cells 12 by activating a corresponding switch transistor 504.

The plurality of data sense amplifier circuits 502a and 502b may be configured on opposite sides of the memory cell array 20. In an exemplary embodiment, each data sense amplifier circuit 502a or 502b may be alternatively coupled to a single memory cell 12 in a row of plurality of memory cells 12. For example, the data sense amplifier circuitry 502a may be coupled to memory cells 12 having even number designations and the data sense amplifier circuitry 502b may be coupled to memory cells 12 having odd number designations. For example, the data sense amplifier circuitry 502a may be coupled to the memory cells 12 having the even number designation (e.g., memory cell <0>, memory cell <2>, memory cell <4>, and memory cell <6>). The data sense amplifier circuitry 502b may be coupled to the memory cells 12 having an odd number designation (e.g., memory cell <1>, memory cell <3>, memory cell <5>, and memory cell <7>).

Figure 6:
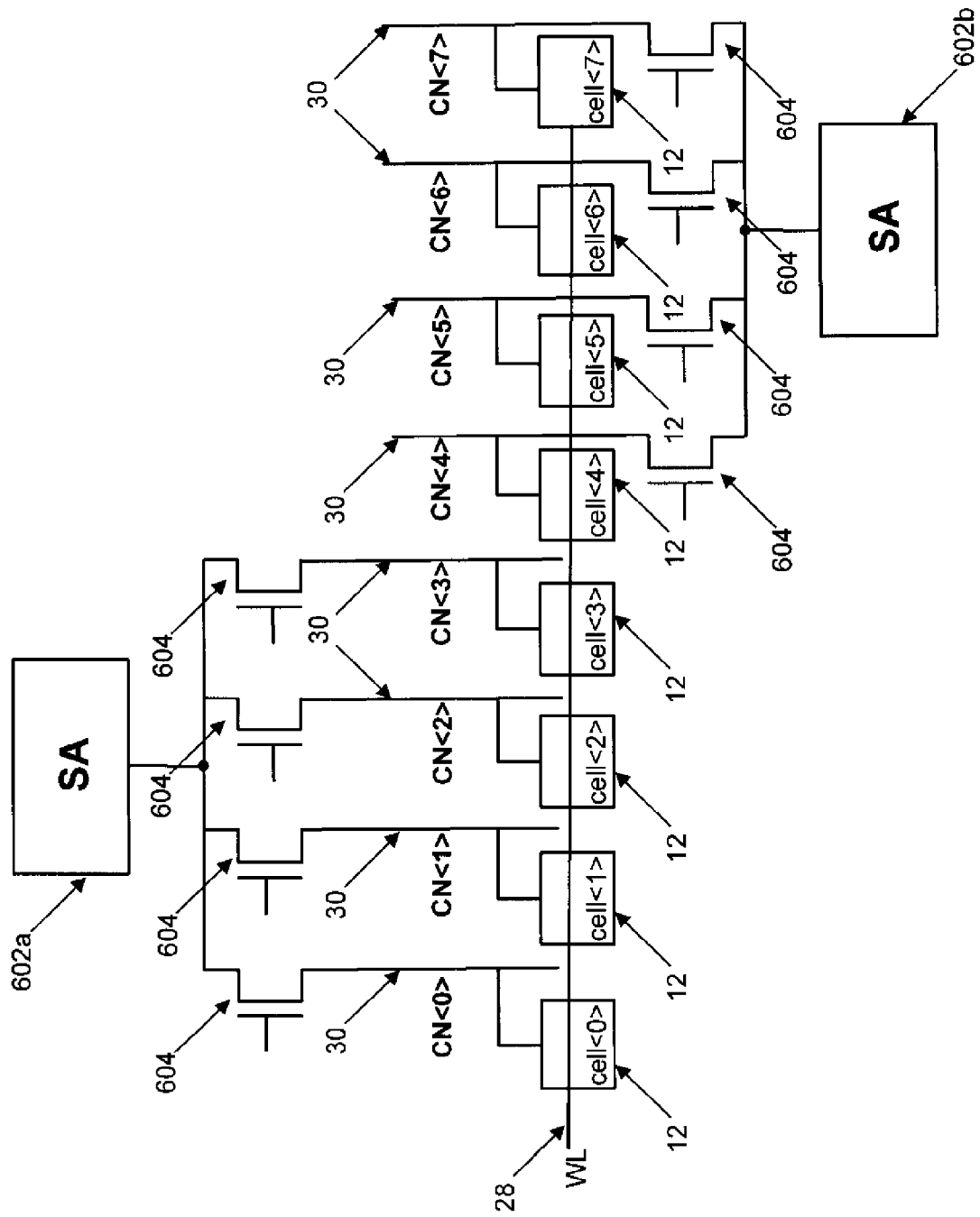
FIG. 6 shows a schematic diagram of a semiconductor memory device having a plurality of memory cells coupled to a plurality of data sense amplifier circuits in accordance with another embodiment of the present disclosure.

Referring to FIG. 6, there is shown a schematic diagram of a semiconductor memory device 10 having a plurality of memory cells 12 coupled to a plurality of data sense amplifier circuits 602 in accordance with another embodiment of the present disclosure. A plurality of memory cells 12 (e.g., memory cell <0>, memory cell <1>, memory cell <2>, memory cell <3>, memory cell <4>, memory cell <5>, memory cell <6>, and memory cell <7>) may be coupled to a plurality of data sense amplifier circuits 602a or 602b. The plurality of memory cells 12 may be arranged in a row in the memory cell array 20. Each of the memory cells 12 may be coupled to data sense amplifier circuitry 602a or 602b via a corresponding bit line (CN) 30 and a corresponding switch transistor 604. The data sense amplifier circuitry 602 may determine a data state (e.g., logic high (binary "1" data state) or logic low (binary "0" data state)) stored in one or more memory cells 12 by activating a corresponding switch transistor 604.

The plurality of data sense amplifier circuits 602a and 602b may be configured on opposite sides of the memory cell array 20. In an exemplary embodiment, each data sense amplifier circuit 602a or 602b may be coupled to a group of adjacent/contiguous memory cells 12. For example, the data sense amplifier circuitry 602a may be coupled to a first group of adjacent/contiguous memory cells 12 (e.g., memory cell <0>, memory cell <1>, memory cell <2>, and memory cell <3>). The data sense amplifier circuitry 602b may be coupled to a second group of adjacent/contiguous memory cells 12 (e.g., the memory cell <4>, memory cell <5>, memory cell <6>, and memory cell <7>).

Figure 7:
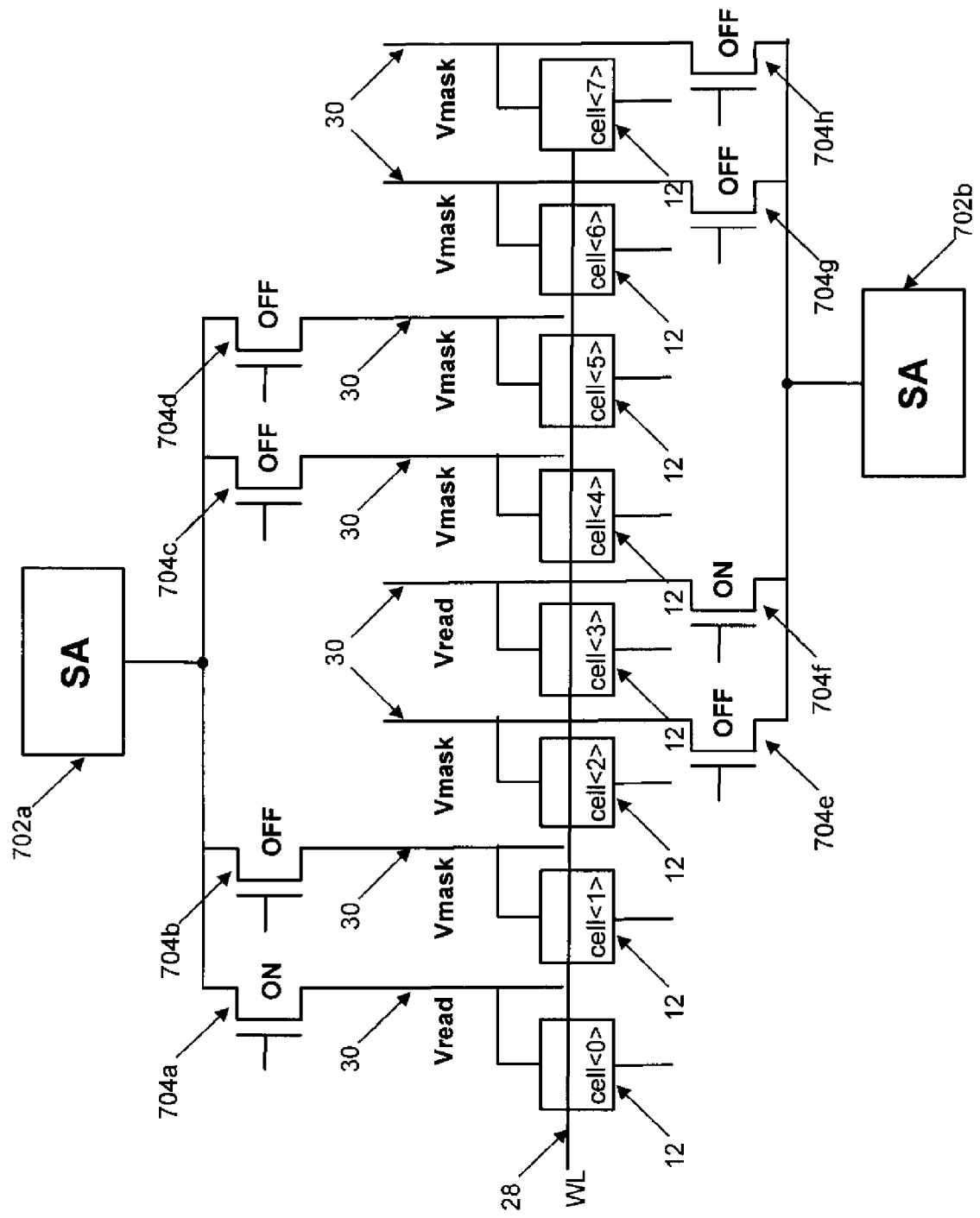
FIG. 7 shows a method of biasing a semiconductor memory device to perform a read operation in accordance with an embodiment of the present disclosure.

Referring to FIG. 7, there is shown a method of biasing a semiconductor memory device 10 to perform a read operation in accordance with an embodiment of the present disclosure. The read operation may include control signals configured to bias one or more memory cells 12 in order to determine data state (e.g., logic low (binary "0" data state) or logic high (binary "1" data state)) stored in the one or more memory cells 12. For example, control signals may be applied to one or more switch transistors 704a-h to activate (e.g., an "ON" state) or deactivate (e.g., an "OFF" state) the one or more switch transistors 704a-h to couple one or more selected memory cells 12 to data sense amplifier circuitry 702a or 702b. Also, control signals may be applied to the one or more selected memory cells 12 via one or more corresponding bit lines (CN) 30 in order to perform a read operation.

During conventional read operations, noise may be generated when the voltage potential applied to the bit lines (CN) 30 vary. For example, a voltage potential variation on the bit lines (CN) 30 during the conventional read operation may generate bit line cross-talk due to capacitance between adjacent bit lines (CN) 30. However, the method of biasing the semiconductor memory device 10 to perform a read operation in accordance with the present disclosure will reduce and/or eliminate the noise generated when the voltage potential applied to the bit line (CN) 30 varies. For example, control signals may be applied to two non-contiguous selected memory cells 12 via corresponding bit lines (CN) 30 to perform a read operation. Thus, one or more unselected memory cells 12 between the two non-contiguous selected memory cells 12 may provide a shielding mechanism between the two non-contiguous selected memory cells 12 in order to reduce and/or eliminate the cross-talk between adjacent bit lines due to capacitance between adjacent bit lines (ON) 30.

In an exemplary embodiment, control signals may be applied to the switch transistors 704a and 704f in order to turn the switch transistors 704a and 704f to an "ON" state to couple the selected memory cells 12 (e.g., memory cell <0> and memory cell <4>) to the data sense amplifier circuitry 702a and 702b, respectively. The control signals may be applied to the switch transistors 704b, 704c, and 704d to turn the switch transistors 704b, 704c, and 704d to an "OFF" state in order to decouple the unselected memory cells 12 (e.g., memory cell <1>, memory cell <4>, and memory cell <5>) from the data sense amplifier circuitry 702a. Also, control signals may be applied to the switch transistors 704e, 704g, and 704h to turn the switch transistors 704e, 704g, and 704h to an "OFF" state in order to decouple the unselected memory cells 12 (e.g., memory cell <2>, memory cell <6>, and memory cell <7>) from the data sense amplifier circuitry 702b.

Control signals ($V_{read}$) may be applied to the bit lines (CN) 30 corresponding to the selected memory cells 12 (e.g., memory cell <0> and memory cell <3>) in order to perform a read operation. Also, control signals ($V_{mask}$) may be applied to the bit lines (CN) 30 corresponding to the unselected memory cells 12 (e.g., memory cell <1>, memory cell <2>, memory cell <4>, memory cell <5>, memory cell <6>, and memory cell <7>) to perform a masking operation. In an exemplary embodiment, after the application of the control signals ($V_{mask}$) to the bit lines (CN) 30 that are corresponding to the unselected memory cells 12 (e.g., memory cell <1>, memory cell <2>, memory cell <4>, memory cell <5>, memory cell <6>, and memory cell <7>), the switch transistors 704b, 704c, 704d, 704e, 704g, and 704h may be turned to an "OFF" state. By turning the switch transistors 704b, 704c, 704d, 704e, 704g, and 704h to an "OFF" state, the bit lines (CN) 30 corresponding to the unselected memory cells 12 (e.g., memory cell <1>, memory cell <2>, memory cell <4>, memory cell <5>, memory cell <6>, and memory cell <7>) may be left electrically floating.

The unselected memory cells 12 (e.g., memory cell <1> and memory cell <2>) and the corresponding bit lines (CN) 30 may be interposed between the selected memory cells 12 (e.g., memory cell <0> and memory cell <3>) and the corresponding bit lines (CN) 30. The unselected memory cells 12 (e.g., memory cell <1> and memory cell <2>) and the corresponding bit lines (CN) 30 interposed between the selected memory cells 12 (e.g., memory cell <0> and memory cell <3>) may provide a shielding mechanism to reduce and/or eliminate cross-talk between the selected memory cells 12 (e.g., memory cell <0> and memory cell <3>) and corresponding bit lines (CN) 30.

Figure 8:
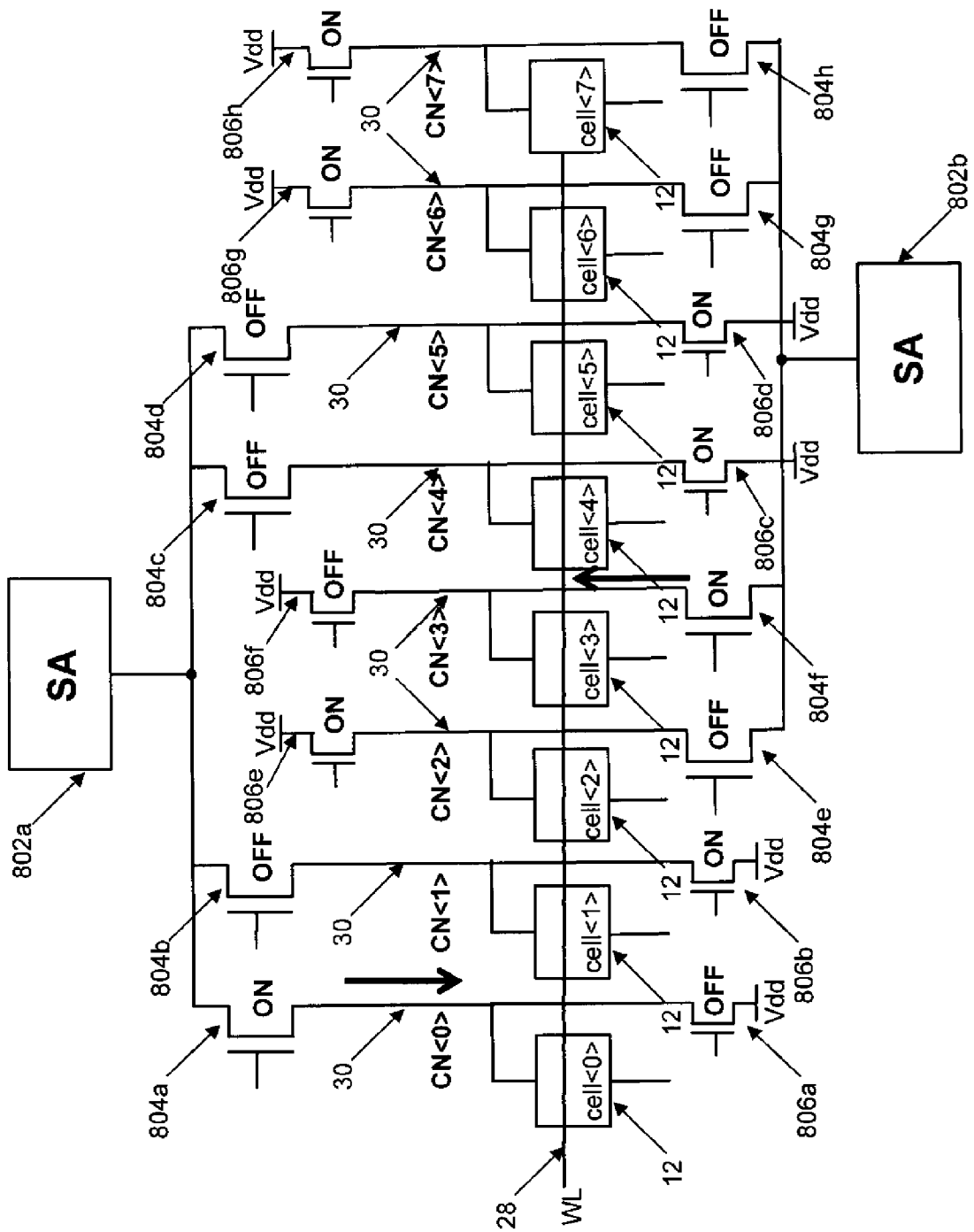
FIG. 8 shows a method of biasing a semiconductor memory device to perform a read operation in accordance with another embodiment of the present disclosure.

Referring to FIG. 8, there is shown a method of biasing a semiconductor memory device 10 to perform a read operation in accordance with another embodiment of the present disclosure. The method of biasing the semiconductor memory device 10 illustrated in FIG. 8 may be similar to the method of biasing the semiconductor memory device 10 illustrated in FIG. 7, except that the bit lines (CN) 30 corresponding to the unselected memory cells 12 (e.g., memory cell <1>, memory cell <2>, memory cell <4>, memory cell <5>, memory cell <6>, and memory cell <7>) may be driven to a predetermined voltage potential.

The plurality of bit lines (CN) 30 may be coupled to a power source (Vdd) (e.g., voltage potential driver and/or current driver) via a plurality of driver transistors 806a-h. For example, the driver transistors 806a and 806f coupled to a selected memory cell 12 via a bit line (CN) 30 may be turned to an "OFF" state during a read operation. The driver transistors 806b, 806c, 806d, 806e, 806g, and 806h coupled to a plurality of unselected memory cells 12 (e.g., memory cell <1>, memory cell <2>, memory cell <4>, memory cell <5>, memory cell <6>, and memory cell <7>) via a plurality of bit lines (CN) 30 may be turned to an "ON" state during a read operation. When the driver transistor 806 is turned to an "ON" state, the driver transistor 806 may couple a voltage potential and/or current to the bit line (CN) 30 from the power source (e.g., voltage potential driver and/or current driver). In contrast, when the driver transistor 806 is turned to an "OFF"

state, the driver transistor 806 may decouple a voltage potential and/or current to the bit line (CN) 30 from the power source (Vdd) (e.g., voltage potential driver and/or current driver).

The driver transistors 806a and 806f may be turned to an "OFF" state to decouple a voltage potential and/or current applied by a power source (Vdd) (e.g., voltage potential driver and/or current driver) from the bit lines (CN) 30 corresponding to the selected memory cells 12 (e.g., memory cell <0> and memory cell <3>). The driver transistors 806b, 806c, 806d, 806e, 806f, 806g, and 806h may be turned to an "ON" state to couple a voltage potential and/or current applied by a power source (Vdd) (e.g., voltage potential driver and/or current driver) to the bit lines (CN) 30 associated with the unselected memory cells 12 (e.g., memory cell <1>, memory cell <2>, memory cell <4>, memory cell <5>, memory cell <6>, and memory cell <7>). The bit lines (CN) 30 associated with the unselected memory cells 12 (e.g., memory cell <1>, memory cell <2>, memory cell <4>, memory cell <5>, memory cell <6>, and memory cell <7>) interposed between the bit lines (CN) 30 associated with the selected memory cells 12 (e.g., memory cell <0> and memory cell <3>) may provide a shielding mechanism to reduce and/or eliminate the bit line (CN) cross-talk due to capacitance between adjacent bit lines (CN) 30.

Figure 9:
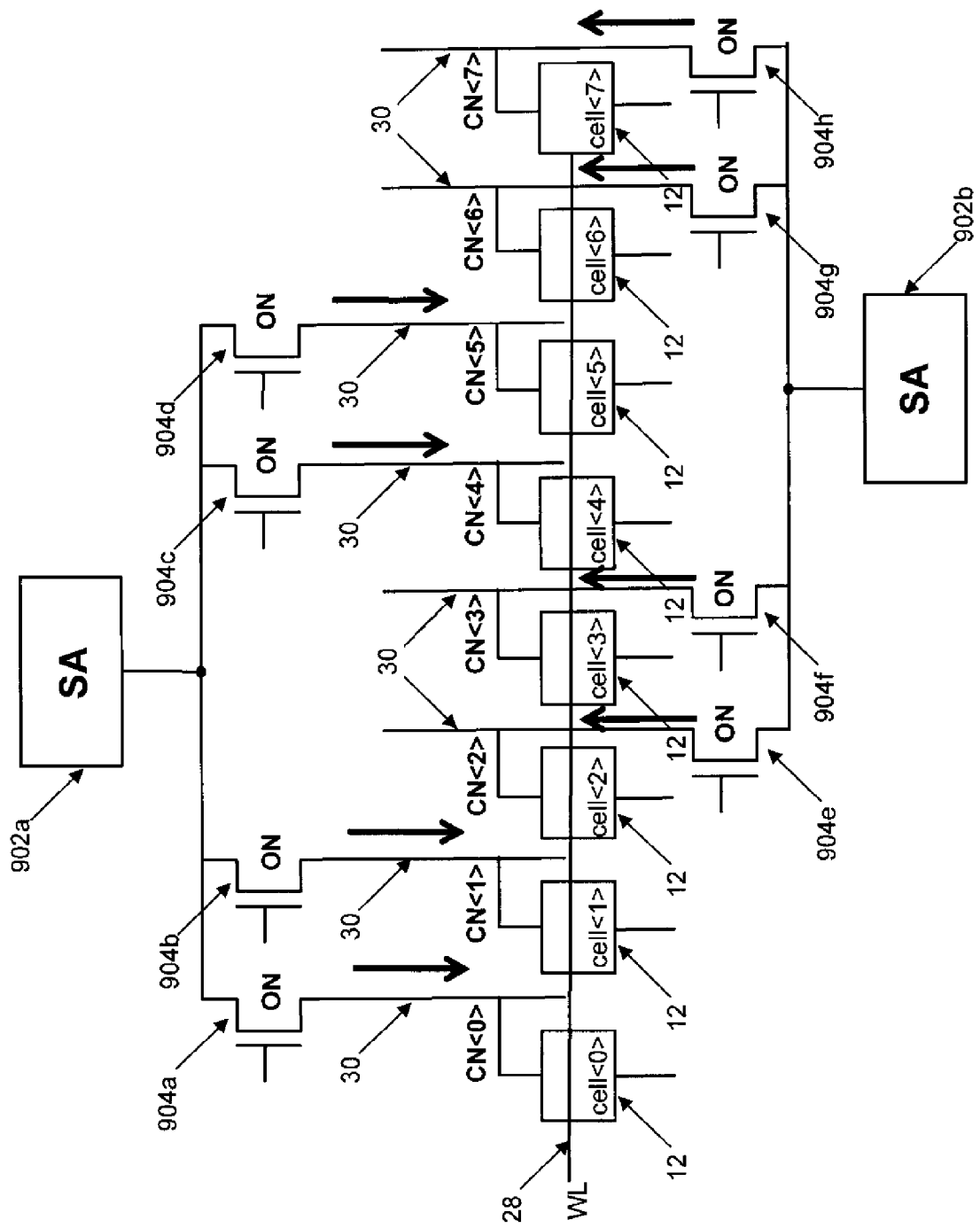
FIG. 9 shows a method of preconditioning a semiconductor memory device to perform a read operation in accordance with an embodiment of the present disclosure.

Referring to FIG. 9, there is shown a method of preconditioning a semiconductor memory device 10 to perform a read operation in accordance with an embodiment of the present disclosure. The semiconductor memory device 10 may be preconditioned in order to perform a read operation to determine data state (e.g., logic low (binary "0" data state) or logic high (binary "1" data state)) stored in the one or more memory cells 12. For example, control signals may be applied to the switch transistors 904a-h in order to couple the memory cells 12 to a plurality of data sense amplifier circuits 902a and 902b. The plurality of data sense amplifier circuits 902a and 902b may apply control signals to the plurality of bit lines (CN) 30 that are coupled to the memory cells 12 in order to precondition the semiconductor memory device 10 for a subsequent read operation. In an exemplary embodiment, each of the plurality of data sense amplifier circuits 902a or 902b may simultaneously apply control signals to a plurality of bit lines (CN) 30 coupled to the memory cells 12. In another exemplary embodiment, the plurality of data sense amplifier circuits 902a and 902b may simultaneously apply control signals to the plurality of bit lines (CN) 30 coupled to the memory cells 12. For example, the plurality of data sense amplifier circuits 902a or 902b may apply a constant voltage potential to the plurality of bit lines (CN) 30 coupled to the memory cells 12. In an exemplary embodiment, the voltage potential applied to the plurality of bit lines (CN) 30 by the plurality of data sense amplifier circuits 902a or 902b may be a masking voltage potential.

By simultaneously applying control signals to the plurality of bit lines (CN) 30 coupled to the memory cells 12 during preconditioning of the semiconductor memory device 10, the bit line (CN) cross-talk due to capacitance between adjacent bit lines (CN) 30 may be reduced and/or eliminated. Also, power consumption by the data sense amplifier circuitry 902a and 902b may be reduced and/or eliminated by simultaneously applying control signals to the plurality of bit lines (CN) 30 coupled to the memory cells 12.

At this point it should be noted that controlling a semiconductor memory device in accordance with the present disclosure as described above typically involves the processing of input data and the generation of output data to some extent. This input data processing and output data generation may be implemented in hardware or software. For example, specific electronic components may be employed in a semiconductor memory device or similar or related circuitry for implementing the functions associated with controlling a semiconductor memory device in accordance with the present disclosure as described above. Alternatively, one or more processors operating in accordance with instructions may implement the functions associated with controlling a semiconductor memory device in accordance with the present disclosure as described above. If such is the case, it is within the scope of the present disclosure that such instructions may be stored on one or more processor readable non-transitory media (e.g., a magnetic disk or other storage medium), or transmitted to one or more processors via one or more signals embodied in one or more carrier waves.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Further, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

The invention claimed is:

1. A method for controlling a semiconductor memory device comprising:
    applying a plurality of voltage potentials to a plurality of memory cells arranged in an array of rows and columns, wherein applying the plurality of voltage potentials to the plurality of memory cells comprises:
        applying a first voltage potential to a first memory cell in a row of the array via a first respective bit line and a first switch transistor;
        applying a second voltage potential to a second memory cell in the row of the array via a second respective bit line and a second switch transistor; and
        applying a third voltage potential to at least one third memory cell in the row of the array via at least one third respective bit line and at least one third switch transistor, wherein the at least one third memory cell is located between the first memory cell and the second memory cell in the row of the array; and wherein the at least one third memory cell comprises:
            a first region coupled to a respective source line of the array;
            a second region coupled to the at least one third respective bit line of the array;
            a body region spaced apart from and capacitively coupled to a respective word line of the array, wherein the body region is electrically floating and disposed between the first region and the second region.

2. The method according to claim 1, wherein the first switch transistor couples the first memory cell to first data sense amplifier circuitry.

3. The method according to claim 2, wherein the second switch transistor couples the second memory cell to second data sense amplifier circuitry.

4. The method according to claim 3, wherein the at least one third switch transistor couples the at least one third memory cell to the first data sense amplifier circuitry or the second data sense amplifier circuitry.

5. The method according to claim 4, wherein the first voltage potential, the second voltage potential, and the third voltage potential are simultaneously applied by the first data sense amplifier circuitry or the second data sense amplifier circuitry.

6. The method according to claim 5, wherein the first voltage potential, the second voltage potential, and the third voltage potential are equal.

7. The method according to claim 6, wherein the first voltage potential, the second voltage potential, and the third voltage potential are equal to a masking operation voltage potential.

8. The method according to claim 1, wherein the first voltage potential is applied by first data sense amplifier circuitry to determine a data state stored in the first memory cell.

9. The method according to claim 8, wherein the second voltage potential is applied by second data sense amplifier circuitry to determine a data state stored in the second memory cell.

10. The method according to claim 9, wherein the third voltage potential is applied by the first data sense amplifier circuitry or the second data sense amplifier circuitry to mask the at least one third memory cell from disturbance.

11. The method according to claim 10, wherein the third voltage potential is applied to at least two of the at least one third memory cell in the row of the array via at least two of the at least one third respective bit line.

12. The method according to claim 9, wherein the at least one third respective bit line is electrically floating after the application of the third voltage potential.

13. The method according to claim 12, wherein the third voltage potential is maintained via at least one respective driver transistor.

14. A semiconductor memory device comprising:
a plurality of memory cells arranged in an array of rows and columns, at least one of the plurality of memory cells comprising:
  a first region coupled to a respective source line of the array;
  a second region coupled to a respective bit line of the array, wherein the respective bit line of the array is coupled to data sense amplifier circuitry via a switch transistor;
  a body region spaced apart from and capacitively coupled to a respective word line of the array, wherein the body region is electrically floating and disposed between the first region and the second region; and
  a third region coupled to a respective carrier injection line of the array, wherein the third region is disposed adjacent to the first region or the second region.

15. The semiconductor memory device according to claim 14, wherein the respective bit line is one of a plurality of bit lines in the array that are coupled to the data sense amplifier circuitry.

16. The semiconductor memory device according to claim 14, wherein the data sense amplifier circuitry is one of a plurality of data sense amplifier circuits in the array.

17. The semiconductor memory device according to claim 16, wherein at least some of the plurality of data sense amplifier circuits are configured on opposite sides of the array.

18. The semiconductor memory device according to claim 16, wherein at least some of the plurality of data sense amplifier circuits are alternatively coupled to the plurality of memory cells of the array.

19. The semiconductor memory device according to claim 18, wherein at least some of the plurality of data sense amplifier circuits are alternatively coupled to a pair of memory cells in the row of the array.

20. The semiconductor memory device according to claim 14, wherein at least some of the plurality of data sense amplifier circuits are alternatively coupled to a single memory cell in the row of the array.

21. The semiconductor memory device according to claim 14, wherein the switch transistor is one of a plurality of switch transistors in the array that are coupled to the data sense amplifier circuitry.

22. The semiconductor memory device according to claim 14, further comprising a driver transistor coupling the respective bit line of the array to a power source.

23. The semiconductor memory device according to claim 22, wherein the driver transistor is one of a plurality of driver transistors in the array.

* * * * *